US012513880B2

(12) United States Patent
Yoo

(10) Patent No.: US 12,513,880 B2
(45) Date of Patent: Dec. 30, 2025

(54) SEMICONDUCTOR DEVICE

(71) Applicant: SAMSUNG ELECTRONICS CO., LTD., Suwon-si (KR)

(72) Inventor: Jongmyung Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 354 days.

(21) Appl. No.: 18/139,546

(22) Filed: Apr. 26, 2023

(65) Prior Publication Data

US 2024/0049440 A1 Feb. 8, 2024

(30) Foreign Application Priority Data

Aug. 2, 2022 (KR) .................. 10-2022-0096272

(51) Int. Cl.
*H10B 12/00* (2023.01)
*H10D 1/00* (2025.01)
*H10D 1/68* (2025.01)

(52) U.S. Cl.
CPC ........... *H10B 12/033* (2023.02); *H10D 1/042* (2025.01); *H10D 1/716* (2025.01)

(58) Field of Classification Search
CPC .. H10B 12/033; H10B 12/053; H10B 12/315; H10B 12/30; H10D 1/042; H10D 1/716; H10D 1/696; H10D 1/714
See application file for complete search history.

(56) References Cited

U.S. PATENT DOCUMENTS

| 7,126,180 | B2 | 10/2006 | Park |
| 7,161,205 | B2 | 1/2007 | Choi et al. |
| 11,569,344 | B2* | 1/2023 | Kang ..................... H10D 1/042 |

(Continued)

FOREIGN PATENT DOCUMENTS

| KR | 10-2005-0000902 A | 1/2005 |
| KR | 10-0555533 B1 | 3/2006 |

(Continued)

OTHER PUBLICATIONS

Communication dated May 9, 2024, issued by the Taiwan Intellectual Property Office in Taiwanese Application No. 112118791.

*Primary Examiner* — David Vu
(74) *Attorney, Agent, or Firm* — Sughrue Mion, PLLC

(57) ABSTRACT

A semiconductor device includes a substrate, a lower electrode on the substrate and extending in a vertical direction, a supporter surrounding at least a portion of sidewalls of the lower electrode and supporting the lower electrode, a dielectric layer on the lower electrode and the supporter, an upper electrode on the lower electrode and at least a portion of the dielectric layer, wherein the dielectric layer is between the upper electrode and the lower electrode, and a liner film between the lower electrode and the supporter, the liner film surrounding an upper portion of the lower electrode, where the lower electrode includes a first metal nitride including a first metal, the liner film includes a second metal nitride including a second metal, a first ratio of the first metal in the first metal nitride is higher than a second ratio of the second metal in the second metal nitride, and a third ratio of nitrogen atoms in the first metal nitride is lower than a fourth ratio of nitrogen atoms in the second metal nitride.

20 Claims, 26 Drawing Sheets

(56) References Cited

U.S. PATENT DOCUMENTS

| | | |
|---|---|---|
| 2007/0015356 A1 | 1/2007 | Lee et al. |
| 2009/0273882 A1* | 11/2009 | Park ................ H10D 1/694 |
| | | 361/305 |
| 2014/0138794 A1 | 5/2014 | Yang et al. |
| 2016/0049460 A1 | 2/2016 | Kim et al. |
| 2022/0238641 A1 | 7/2022 | Park et al. |
| 2022/0415891 A1 | 12/2022 | Hsiao et al. |

FOREIGN PATENT DOCUMENTS

| | | |
|---|---|---|
| KR | 10-2009-0022678 A | 3/2009 |
| KR | 10-0919674 B1 | 10/2009 |
| KR | 10-2009-0116398 A | 11/2009 |
| TW | 200509403 A | 3/2005 |
| TW | I769873 B | 7/2022 |

\* cited by examiner

SEMICONDUCTOR DEVICE

CROSS-REFERENCE TO RELATED APPLICATION

This application is based on and claims priority under 35 U.S.C. § 119 to Korean Patent Application No. 10-2022-0096272, filed on Aug. 2, 2022, in the Korean Intellectual Property Office, the disclosure of which is incorporated herein by reference in its entirety.

BACKGROUND

1. Field

One or more example embodiments of the disclosure relate to a semiconductor device, and more particularly, to a semiconductor device including a capacitor.

2. Description of Related Art

As semiconductor memory devices are increasingly highly integrated, individual circuit patterns are becoming more miniaturized in order to implement more semiconductor memory devices within the same area. In other words, as the degree of integration of semiconductor memory devices increases, the design rules of components of semiconductor memory devices decrease in size.

In a highly scaled semiconductor memory device, a process of forming capacitors becomes increasingly complex and difficult. In a miniaturized semiconductor device, a limit is being reached in securing a desired capacitance with capacitors employing related art structures.

As the aspect ratio increases, the benzothiophene (BT) ratio degradation problem in which upper holes become large and lower holes become small occurs. When the hole of an opening becomes large, the separation distance between the lower electrodes decreases, and thus current leakage may occur.

In related art, to solve the above-stated problem, SiCN is intentionally deposited onto the hole of the opening through a chemical vapor deposition (CVD) process with poor step coverage. In this case, due to a relatively thick application on an upper portion the hole of the opening and a relatively thin application on a lower portion the hole of the opening, the BT ratio may be enhanced. However, an opening may be blocked or narrowed, and thus, lower electrode bending may occur due to formation of a seam in a lower electrode in a subsequent lower electrode forming process.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided a semiconductor device including a capacitor with improved performance and reliability.

Additional aspects will be set forth in part in the description which follows and, in part, will be apparent from the description, or may be learned by practice of the presented embodiments.

According to an aspect of an example embodiment, a semiconductor device may include a substrate, a lower electrode on the substrate and extending in a vertical direction, a supporter surrounding at least a portion of sidewalls of the lower electrode and supporting the lower electrode, a dielectric layer on the lower electrode and the supporter, an upper electrode on the lower electrode and at least a portion of the dielectric layer, wherein the dielectric layer is between the upper electrode and the lower electrode, and a liner film between the lower electrode and the supporter, the liner film surrounding an upper portion of the lower electrode, where the lower electrode includes a first metal nitride including a first metal, the liner film includes a second metal nitride including a second metal, a first ratio of the first metal in the first metal nitride is higher than a second ratio of the second metal in the second metal nitride, and a third ratio of nitrogen atoms in the first metal nitride is lower than a fourth ratio of nitrogen atoms in the second metal nitride.

According to an aspect of an example embodiment, a semiconductor device may include a substrate, a structure on the substrate, a liner film over a lower electrode trench and penetrating the structure, and a lower electrode provided in the lower electrode trench and covering at least a portion of the liner film, where the structure includes a supporter surrounding at least a portion of sidewalls of the liner film and at least a portion of sidewalls of the lower electrode, and supporting the lower electrode, and supporting the lower electrode, a dielectric layer on the lower electrode and the supporter, and an upper electrode on the lower electrode and at least a portion of the dielectric layer, wherein the dielectric layer is between the upper electrode and the lower electrode, where the lower electrode includes a first metal nitride including a first metal, the liner film includes a second metal nitride including a second metal, a first ratio of the first metal in the first metal nitride is higher than a second ratio of the second metal in the second metal nitride, and a third ratio of nitrogen atoms in the first metal nitride is lower than a fourth ratio of nitrogen atoms in the second metal nitride.

According to an aspect of an example embodiment, a semiconductor device may include a substrate, an active region defined by a device isolation layer in the substrate, a word line in the substrate and extending across the active region in a first horizontal direction, a bit line extending over the word line in a second horizontal direction perpendicular to the first horizontal direction, and a capacitor at a level than a level of the bit line. The capacitor may include a lower electrode on the substrate and extending in a vertical direction, a supporter surrounding sidewalls of the lower electrode and supporting the lower electrode, a dielectric layer on the lower electrode and the supporter, an upper electrode on the lower electrode and at least a portion of the dielectric layer, wherein the dielectric layer is between the upper electrode and the lower electrode, and a liner film surrounding an upper portion of the lower electrode, where a horizontal width of the upper portion of the lower electrode surrounded by the liner film is greater than a horizontal width of a lower portion of the lower electrode, the lower portion of the lower electrode not being surrounded by the liner film, the lower electrode includes a first metal nitride including a first metal, the liner film includes a second metal nitride including a second metal, the first metal and the second metal include a same type of metal element, a first ratio of the first metal in the first metal nitride is higher than a second ratio of the second metal in the second metal nitride, a third ratio of nitrogen atoms in the first metal nitride is about 30 at % or higher and is less than about 50 at %, and a fourth ratio of nitrogen atoms in the second metal nitride is about 50 at % or higher and is about 70 at % or less.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
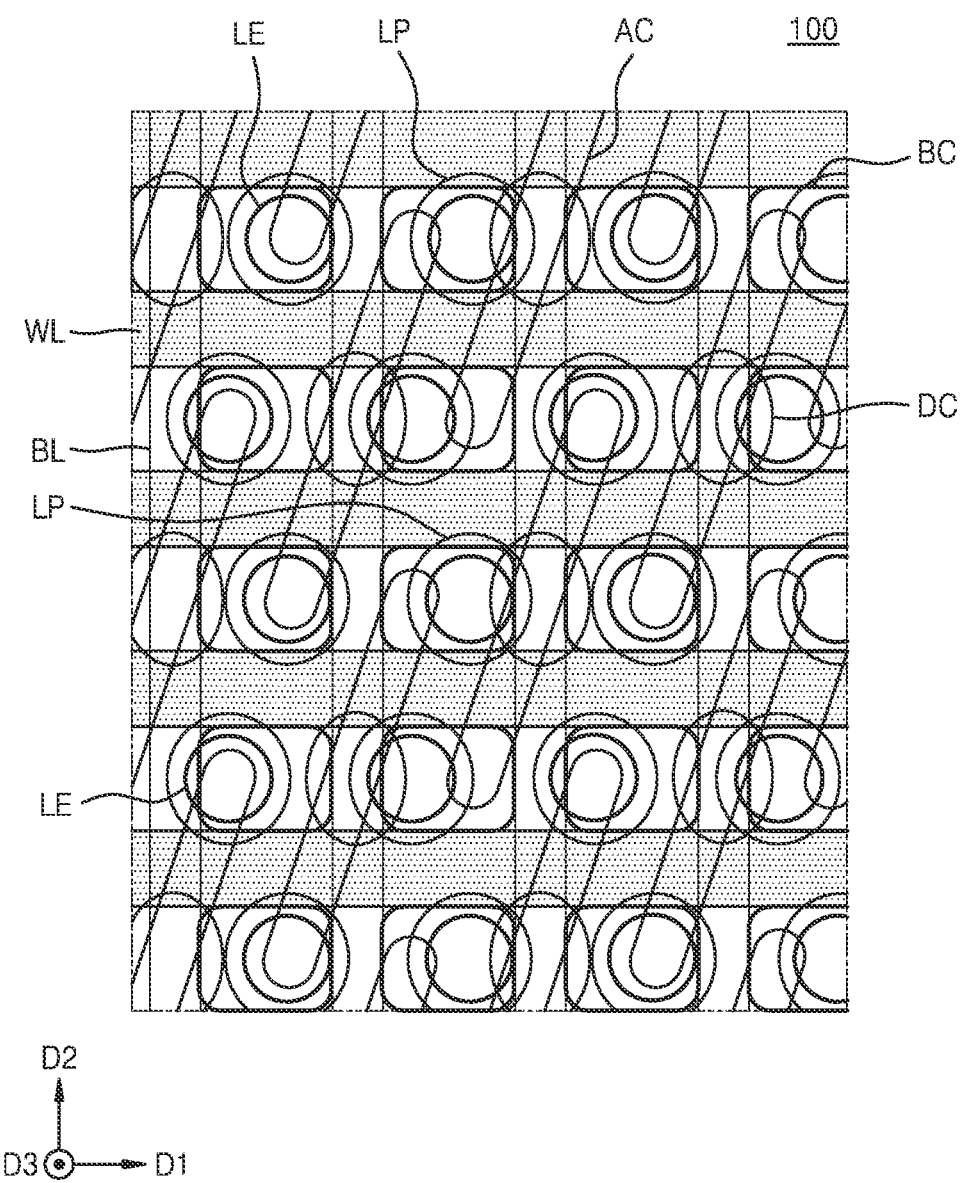
FIG. 1 is a diagram of components of a memory cell array region of a semiconductor device according to an example embodiment.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram of components of a memory cell array region of a semiconductor device according to an example embodiment.

Referring to FIG. 1, a semiconductor device 100 may include a plurality of active regions AC arranged to horizontally extend in a diagonal direction with respect to a first direction D1 and a second direction D2 on a plane. A plurality of word lines WL may extend parallel to one another in the first direction D1 across the plurality of active regions AC. A plurality of bit lines BL may extend parallel to one another in the second direction D2 crossing the first direction D1 over the plurality of word lines WL. The plurality of bit lines BL may be connected to the plurality of active regions AC via a plurality of direct contacts DC, respectively.

A plurality of buried contacts BC may each be arranged between two bit lines BL adjacent to each other from among the bit lines BL. A plurality of conductive landing pads LP may be respectively arranged on the plurality of buried contacts BC. The conductive landing pads LP may be arranged to at least partially overlap the buried contacts BC, respectively. A plurality of lower electrodes LE may be arranged to be apart from one another on the landing pads LP, respectively. The lower electrodes LE may be connected to the active regions AC through the buried contacts BC and the conductive landing pads LP, respectively.

Figure 2:
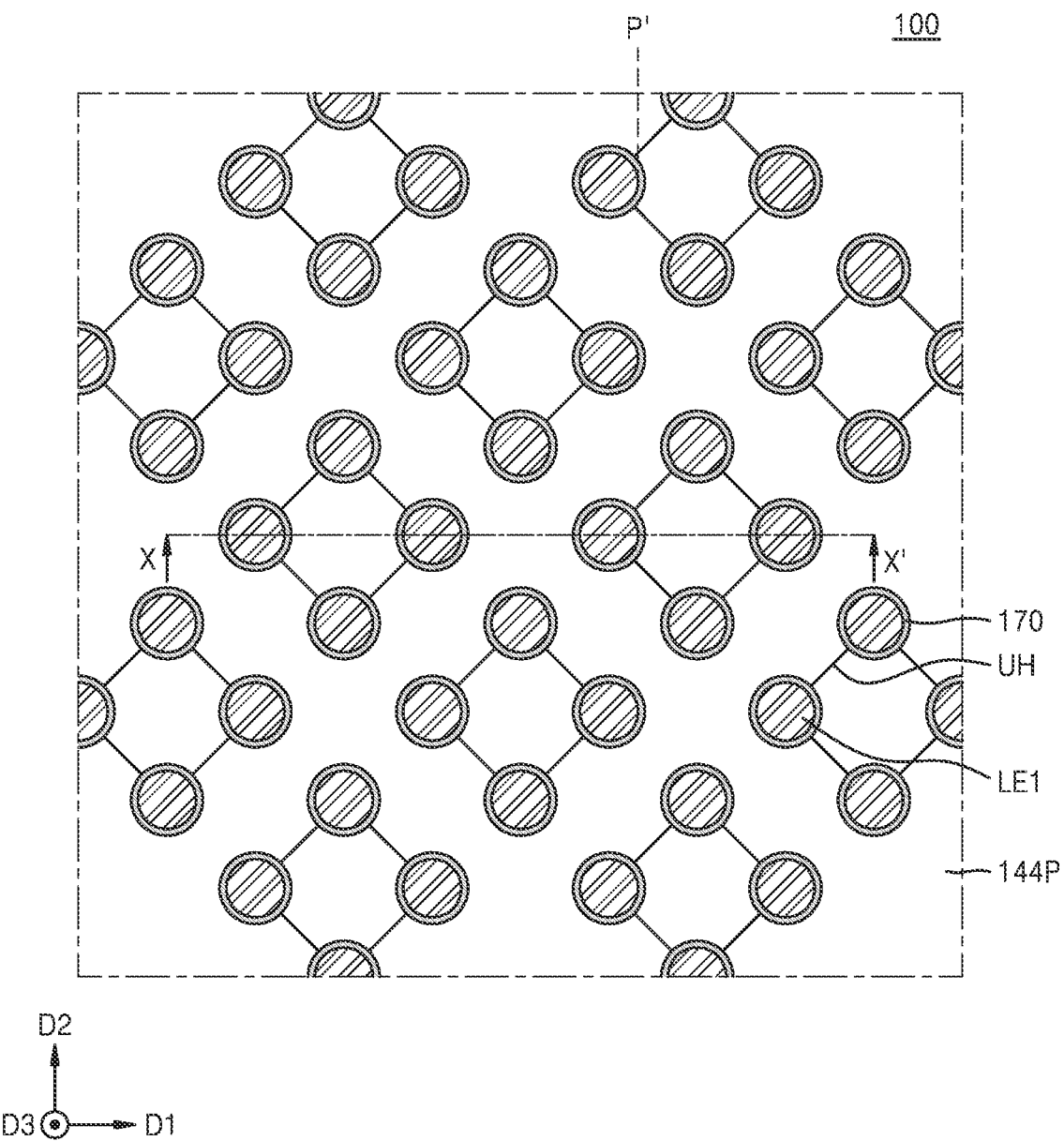
FIG. 2 is a diagram of components of a semiconductor device according to an example embodiment.
Figure 3A:
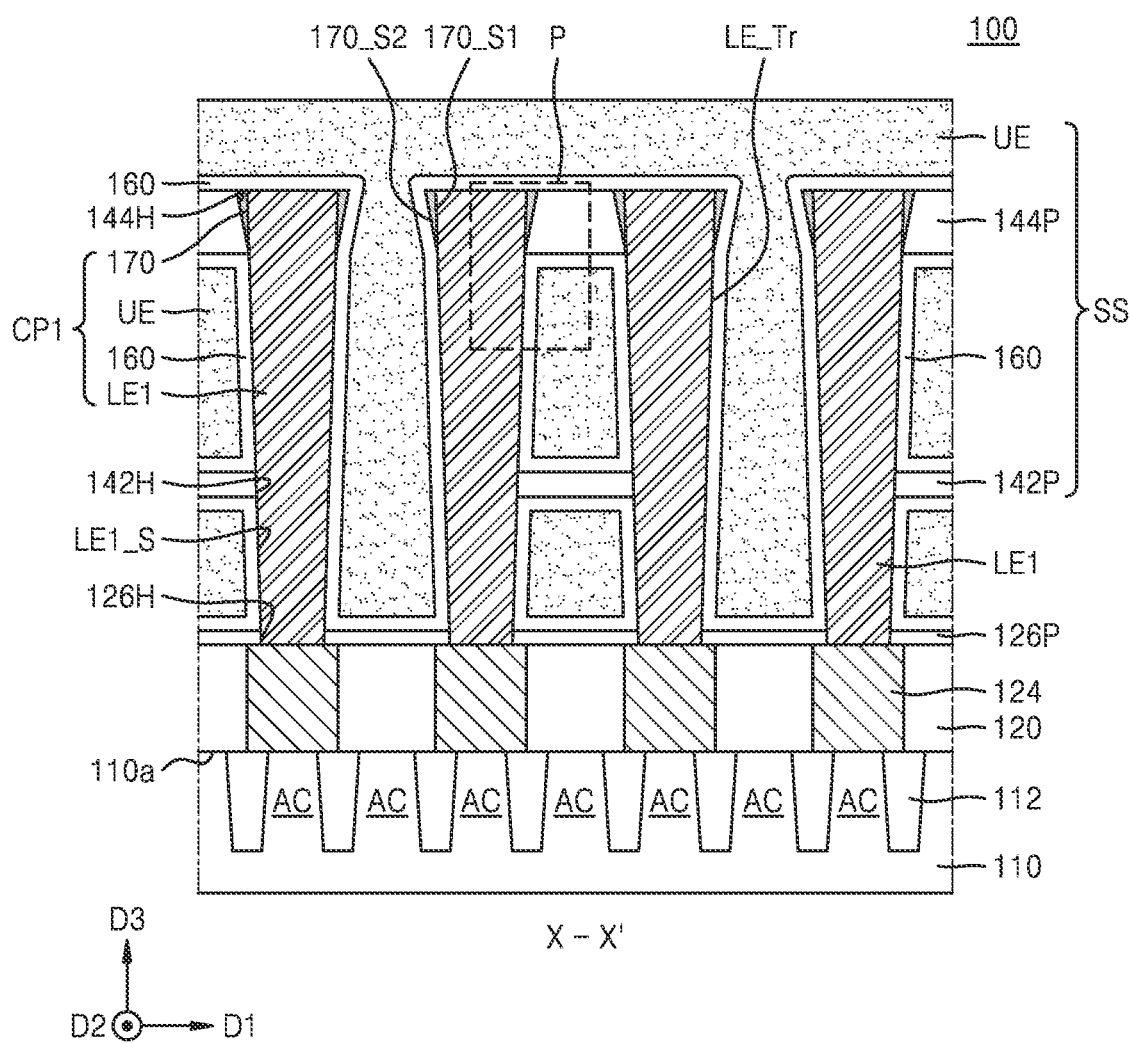
FIG. 3A is a cross-sectional view taken along a line X-X' of FIG. 2 according to an example embodiment.
Figure 3B:
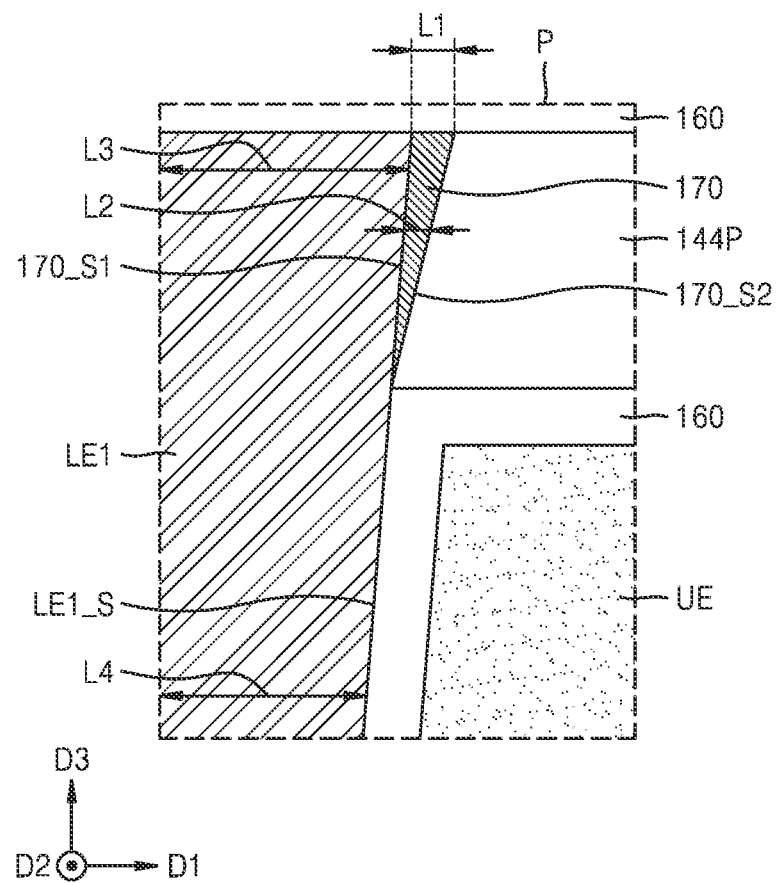
FIGS. 3B and 3C are enlarged cross-sectional views of a region P of FIG. 3A according to an example embodiment.
Figure 3C:
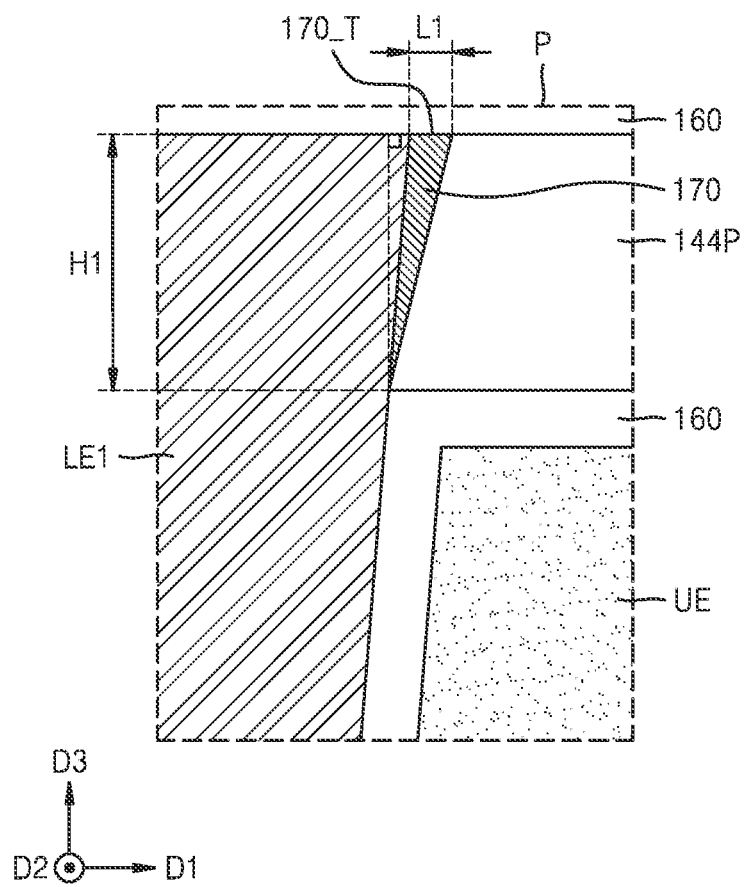
Figure 3D:
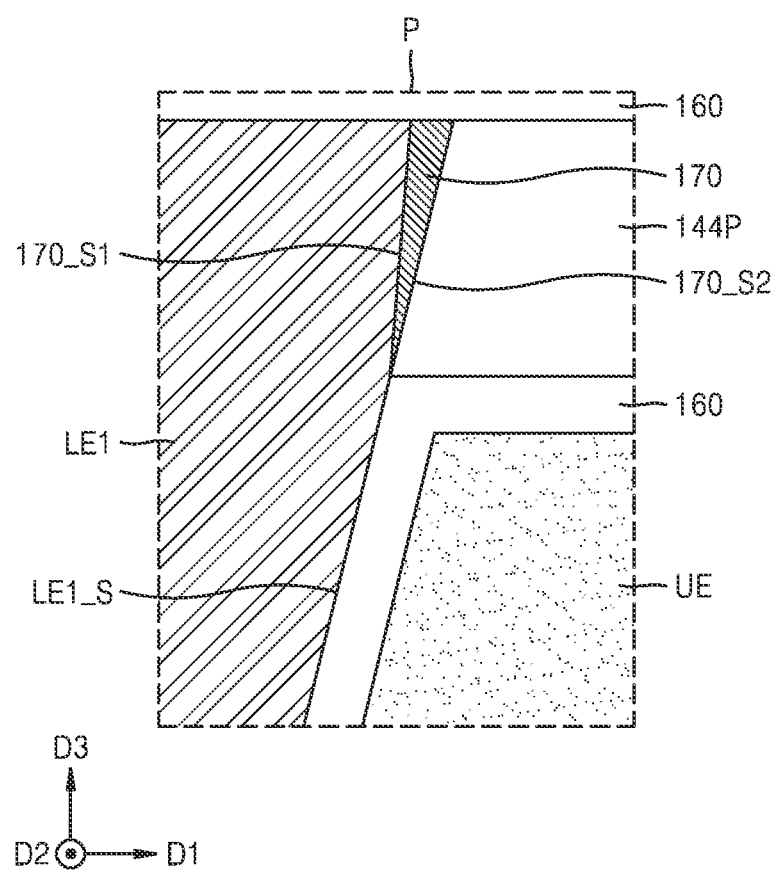
FIG. 3D is a cross-sectional view of an example of a structure of the region P shown in FIGS. 3B and 3C according to an example embodiment.

FIG. 2 is a diagram of components of a semiconductor device according to an example embodiment. FIG. 3A is a cross-sectional view taken along a line X-X' of FIG. 2 according to an example embodiment. FIGS. 3B and 3C are enlarged cross-sectional views of a region P of FIG. 3A according to an example embodiment. FIG. 3D is a cross-sectional view of an example of a structure of the region P shown in FIGS. 3B and 3C according to an example embodiment.

Referring to FIGS. 2 and 3A to 3C, the semiconductor device 100 may include a substrate 110 and a lower structure 120 formed on the substrate 110, where the substrate 110 may include the plurality of active regions AC. A plurality of conductive regions 124 may penetrate through the lower structure 120 and be connected to the plurality of active regions AC, respectively.

The substrate 110 may include a semiconductor element like Si or Ge or a compound semiconductor like SiC, GaAs, InAs, and InP. The substrate 110 may include a semiconductor substrate and at least one insulation layer, which is formed on the semiconductor substrate, or structures including at least one conductive region. The conductive region may include a well doped with impurities or a structure doped with impurities. A device isolation layer 112 defining the plurality of active regions AC may be formed in the substrate 110. The device isolation layer 112 may include an oxide film, a nitride film, or a combination thereof. According to embodiments, the device isolation layer 112 may have various structures like a shallow trench isolation (STI) structure.

According to some embodiments, the lower structure 120 may include an insulation film including a silicon oxide film, a silicon nitride film, or a combination thereof. According to some embodiments, the lower structure 120 may include various conductive regions, like a wiring layer, a contact plug, and a transistor, and insulation films that insulate the conductive regions from one another. The plurality of conductive regions 124 may include polysilicon, a metal, conductive metal nitride, metal silicide, or a combination thereof. The lower structure 120 may include the plurality of bit lines BL described with reference to FIG. 1. The plurality of conductive regions 124 may each include a buried contact BC and a conductive landing pad LP described above with reference to FIG. 1.

An insulation pattern 126P having a plurality of holes 126H respectively overlapping the plurality of conductive regions 124 in a third direction D3 may be disposed over the lower structure 120 and the plurality of conductive regions 124. The insulation pattern 126P may include a silicon nitride (SiN) film, a silicon carbon nitride (SiCN) film, a silicon boron nitride (SiBN) film, or a combination thereof. The terms "SiN", "SiCN", and "SiBN" used herein refer to materials composed of elements included in the respective terms and are not chemical formulas indicating stoichiometric relationships.

A plurality of capacitors CP1 may be respectively arranged on the plurality of conductive regions 124. The plurality of capacitors CP1 may each include a lower electrode LE1 extending in the third direction D3 perpendicular to a top surface 110a of the substrate 110, a lower supporter 142P and an upper supporter 144P surrounding sidewalls of the lower electrode LE1 and supporting the lower electrode LE1, a dielectric layer 160 disposed over the lower electrode LE1 and the lower supporter 142P and the upper supporter 144P, an upper electrode UE spaced apart from the lower electrode LE1 with the dielectric layer 160 therebetween, and a liner film 170 disposed between the lower electrode LE1 and the upper supporter 144P and surrounding the upper portion of the lower electrode LE1.

The insulation pattern 126P may be disposed adjacent to the lower end of each of the lower electrodes LE1. The plurality of lower electrodes LE1 may each have a pillar-like shape extending from the top surface of a conductive region 124 in a direction away from the substrate 110 in the vertical direction (i.e., the third direction D3) through a hole 126H of the insulation pattern 126P. Although a case where each of the plurality of lower electrodes LE1 has a pillar-like shape is exemplified in the drawings, embodiments of the disclosure are not limited thereto. For example, the plurality of lower electrodes LE1 may each have a cross-sectional structure having a cup-like shape or the shape of a cylinder with a closed bottom.

The plurality of lower electrodes LE1 may be supported by the lower supporter 142P and the upper supporter 144P. The plurality of lower electrodes LE1 and the upper electrode UE may face each other with the dielectric layer 160 therebetween.

The dielectric layer 160 may cover the lower electrode LE1, the lower supporter 142P, and the upper supporter 144P. When the liner film 170 is disposed between the lower electrode LE1 and the lower supporter 142P and the upper supporter 144P as shown in FIGS. 2 and 3A to 3C, the dielectric layer 160 may contact a portion of the liner film 170 surrounding the upper portion of the lower electrode LE1 and cover the liner film 170.

As shown in FIG. 3A, the upper supporter 144P may extend parallel to the substrate 110 while surrounding the upper portion of each of the plurality of lower electrodes LE1. A plurality of holes 144H through which the plurality of lower electrodes LE1 pass may be formed in the upper supporter 144P. The liner film 170 is disposed on the inner sidewall of each of the plurality of holes 144H formed in the upper supporter 144P, and the plurality of lower electrodes LE1 each covering the liner film 170 disposed on the sidewall of each of the plurality of holes 144H may be arranged. Therefore, the inner sidewall of each of the plurality of holes 144H formed in the upper supporter 144P may not directly contact the outer sidewall of the lower electrode LE1. The top surface of each of the plurality of lower electrodes LE1 and the top surface of the upper supporter 144P may be coplanar with each other. For example, the top surface of each of the plurality of lower electrodes LE1 may be lower than the top surface of the upper supporter 144P.

The lower supporter 142P may extend in parallel to the substrate 110 between the substrate 110 and the upper supporter 144P and may contact the outer sidewalls of the plurality of lower electrodes LE1. A plurality of holes 142H through which the plurality of lower electrodes LE1 pass and a plurality of lower holes LH (refer to FIG. 7G) may be formed in the lower supporter 142P. The plurality of lower electrodes LE1 may extend in the vertical direction (i.e., the third direction D3) through the plurality of holes 144H formed in the upper supporter 144P and the plurality of holes 142H formed in the lower supporter 142P.

FIG. 2 shows a planar structure of each of the upper supporter 144P, the plurality of lower electrodes LE1, and a plurality of liner films 170. As shown in FIG. 2, a plurality of upper holes UH may be formed in the upper supporter 144P. FIG. 2 shows an example of a configuration in which each of the plurality of upper holes UH substantially has a rhombic planar shape in which four adjacent lower electrodes LE1 correspond to respective vertices. However, the planar shape of each of the plurality of upper holes UH is not limited to that illustrated in FIG. 2, and various modifications and changes may be made within the scope of the disclosure. The plurality of lower electrodes LE1 may include portions protruding toward the centers of the upper holes UH to a first point P'. The plurality of lower holes LH (refer to FIG. 7G) having a planar shape corresponding to the planar shape of the plurality of upper holes UH may be formed in the lower supporter 142P. Also, the liner film 170 may be disposed between the lower electrode LE1 and the upper supporter 144P. The liner film 170 is formed to surround the upper portion of the lower electrode LE1, and the liner film 170 surrounding the upper portion of the lower electrode LE1 may be surrounded by the upper supporter 144P supporting the upper portion of the lower electrode LE1.

The lower supporter 142P and the upper supporter 144P may each include a SiN film, a SiCN film, a SiBN film, or a combination thereof. According to embodiments, the lower supporter 142P and the upper supporter 144P may include the same material. According to some embodiments, the lower supporter 142P and the upper supporter 144P may include different materials. According to some embodiments, the lower supporter 142P and the upper supporter 144P may each include SiCN. According to some embodiments, the lower supporter 142P may include SiCN, and the upper supporter 144P may include SiBN. However, the disclosure is not limited to the materials stated above.

The lower electrode LE1 may include a metal-containing film including a first metal. The upper electrode UE may face the lower electrode LE1 with the dielectric layer 160 therebetween. According to embodiments, the upper electrode UE may include the same metal as the first metal. According to some embodiments, the upper electrode UE may include a metal different from the first metal.

The lower electrode LE1 and the upper electrode UE may each include a metal film, a conductive metal oxide film, a conductive metal nitride film, a conductive metal oxynitride film, or a combination thereof. According to embodiments, the lower electrode LE1 and the upper electrode UE may each include Ti, Ti oxide, Ti nitride, Ti oxynitride, Nb, Nb oxide, Nb nitride, Nb oxynitride, Co, Co oxide, Co nitride, Co oxynitride, Sn, Sn oxide, Sn nitride, Sn oxynitride, or combinations thereof. For example, each of the lower electrode LE1 and the upper electrode UE may include NbN, TiN, CoN, $SnO_2$, or a combination thereof. According to some embodiments, the lower electrode LE1 and the upper electrode UE may each include TaN, TiAlN, TaAlN, W, Ru, $RuO_2$, $SrRuO_3$, Ir, $IrO_2$, Pt, PtO, SRO($SrRuO_3$), BSRO((Ba, Sr)$RuO_3$), CRO($CaRuO_3$), LSCO((La,Sr)$CoO_3$), or a combination thereof. However, the materials constituting the lower electrode LE1 and the upper electrode UE are not limited to the examples stated above.

The horizontal thickness of the lower electrode LE1 and the horizontal thickness and/or the vertical thickness of the upper electrode UE may each be from about 1 nm to about 20 nm. Alternatively, according to some embodiments, the horizontal thickness of the lower electrode LE1 and the horizontal thickness and/or the vertical thickness of the upper electrode UE may each be about 20 nm or greater. According to some embodiments, the horizontal thickness of the lower electrode LE1 may be greater than the horizontal thickness and/or the vertical thickness of the upper electrode UE. However, embodiments of the disclosure are not limited thereto, and the horizontal thickness of the lower electrode LE1 may be substantially the same as or less than the horizontal thickness and/or the vertical thickness of the upper electrode UE.

The dielectric layer 160 may include a high-k layer. The term "high-k layer" used herein may refer to a dielectric layer having a higher dielectric constant than that of a silicon oxide film. According to embodiments, the dielectric layer 160 may include a metal oxide including at least one metal selected from among hafnium (Hf), zirconium (Zr), aluminum (Al), niobium (Nb), cerium (Ce), lanthanum (La), tantalum (Ta), and titanium (Ti). According to embodiments, the dielectric layer 160 may have a single-layer structure including one high-k layer. According to some embodiments, the dielectric layer 160 may have a multi-layer structure including a plurality of high-k layers. The high-k layer may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof, but is not limited thereto.

According to embodiments, the dielectric layer 160 may include at least one from among a ferroelectric material layer, an antiferroelectric material layer, and a paraelectric material layer. For example, the dielectric layer 160 may include $HfZrO_2$, $ZrO_2$, $PbTiO_3$, $AgNbO_3$, $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof, but is not limited thereto.

According to embodiments, the dielectric layer 160 may include multiple layers in which a plurality of material layers including different materials are stacked. For example, the dielectric layer 160 may include a first dielectric layer contacting the lower electrode LE1 and a second dielectric layer on the first dielectric layer.

The first dielectric layer may include a ferroelectric material layer, an antiferroelectric material layer, or a combination thereof. According to embodiments, the first dielectric layer may include a single layer in which a ferroelectric material and an antiferroelectric material are non-uniformly mixed. According to some embodiments, the first dielectric layer may include a single layer including a ferroelectric material. According to some embodiments, the first dielectric layer may include a single layer including an antiferroelectric material. The second dielectric layer may include a paraelectric material layer.

According to embodiments, the first dielectric layer may include $HfZrO_2$, $ZrO_2$, $PbTiO_3$, $AgNbO_3$, or a combination thereof. The second dielectric layer may include $HfO_2$, $ZrO_2$, $TiO_2$, $Ta_2O_3$, $VO_2$, $AlO_2$, $SiO_2$, $SrTiO_3$, $BaTiO_3$, $BiFeO_3$, or a combination thereof.

According to embodiments, the thickness of the dielectric layer 160 is greater than 0 nm and less than about 6 nm. According to some embodiments, the thickness of the first dielectric layer and the thickness of the second dielectric layer may each be greater than 0 nm and less than about 3 nm. According to some embodiments, the thickness of the first dielectric layer or the second dielectric layer may be from about 3 nm to about 6 nm, but the disclosure is not limited thereto.

Referring to FIGS. 3A to 3C, the liner film 170 surrounding the upper portion of the lower electrode LE1 may be disposed between the lower electrode LE1 and the upper supporter 144P. The liner film 170 surrounding the upper portion of the lower electrode LE1 may contact the upper supporter 144P supporting the upper portion of the lower electrode LE1 and surrounded by the upper supporter 144P. In other words, the lower electrode LE1 and the upper supporter 144P with the liner film 170 therebetween may be spaced apart from each other by the horizontal width of the liner film 170. A top surface 170_T of the liner film 170 may be coplanar with the top surface of the lower electrode LE1.

According to some embodiments, the lower electrode LE1 may include a metal nitride. For example, the lower electrode LE1 may include a first metal nitride containing a first metal. According to some embodiments, the liner film 170 may include a second metal nitride containing a second metal. According to some embodiments, the first metal and the second metal may include the same metal element. For example, both the first metal and the second metal may include Ti. For example, both the first metal and the second metal may include Ta. In other words, both the first metal nitride and the second metal nitride may include TiN or TaN. The terms "TiN" and "TaN" used herein refer to materials composed of elements included in the respective terms and are not chemical formulas indicating stoichiometric relationships.

According to some embodiments, the first metal and the second metal may include different metal elements. For example, the first metal may include Ti, whereas the second metal may include Ta. Alternatively, the first metal may include Ta, whereas the second metal may include Ti. In other words, the first metal nitride and the second metal nitride may include TiN and/or TaN.

According to some embodiments, a ratio of the first metal in the first metal nitride included in the lower electrode LE1 may be higher than a ratio of the second metal in the second metal nitride included in the liner film 170, and a ratio of nitrogen atoms in the first metal nitride included in the lower electrode LE1 may be lower than a ratio of nitrogen atoms in the second metal nitride included in the liner film 170.

The ratio of the first metal in the first metal nitride included in the lower electrode LE1 may be about 50 at % or higher, and the ratio of the second metal in the second metal nitride included in the liner film 170 may be less than about 50 at %. Also, the ratio of nitrogen atoms in the first metal nitride included in the lower electrode LE1 may be about 30 at % or higher and less than about 50 at %, and the ratio of nitrogen atoms in the second metal nitride included in the liner film 170 may be about 50 at % or higher and less than or about 70 at %. For example, the lower electrode LE1 may include the first metal nitride containing the first metal of about 60 at % and nitrogen atoms of about 40 at %, and the liner film 170 may include the second metal nitride containing the second metal of about 40 at % and nitrogen atoms of about 60 at %. The first metal nitride and the second metal nitride may include other types of elements in addition to the first metal, the second metal, and nitrogen atoms. In this case, in the first metal nitride and the second metal nitride, the sum of the composition ratio of the first metal or the second metal and the composition ratio of nitrogen atoms may be less than 100%.

According to some embodiments, a point corresponding to the largest horizontal width of the horizontal width may be located farther from the substrate 110 than a point corresponding to the smallest horizontal width of the liner film 170. For example, as shown in FIGS. 3B and 3C, the liner film 170 may have a cross-sectional shape of a downward-pointed triangle, and one side thereof may be placed on a plane parallel to the top surface 110a of the substrate 110. When the liner film 170 has the triangular cross-section as described above, the point corresponding to the largest horizontal width of the liner film 170 may be on the top surface 170_T of the liner film 170, and the point corresponding to the smallest horizontal width of the liner film 170 may be the point located farthest from the top surface 170_T of the liner film 170 in the vertical direction (i.e., the third direction D3). Also, the point corresponding to the largest horizontal width of the liner film 170 may be located farther from the substrate 110 than points corresponding to non-largest horizontal widths of the liner film 170. For example, the point corresponding to the largest horizontal width L1 of the liner film 170 may be located farther from the substrate 110 than a point corresponding to a non-largest horizontal width L2 of the liner film 170. According to some embodiments, the horizontal width of the liner film 170 may substantially increase in a direction away from the substrate 110 in the vertical direction (i.e., the third direction D3).

According to some embodiments, the largest horizontal width L1 of the liner film 170 may be from about 0.5 nm to about 1.5 nm. In other words, the largest distance between the lower electrode LE1 and the upper supporter 144P in a horizontal direction may be from about 0.5 nm to about 1.5 nm.

According to some embodiments, a horizontal width L3 of the upper portion of the lower electrode LE1 surrounded by the liner film 170 may be greater than a horizontal width L4 of a lower portion of the lower electrode LE1 not surrounded by the liner film 170. In other words, the lower electrode LE1 may be formed, such that the horizontal width L3 of the upper portion of the lower electrode LE1 is greater than the horizontal width L4 of the lower portion of the lower electrode LE1. According to some embodiments, the lower electrode LE1 may be disposed inside a lower electrode trench LE_Tr that penetrates, in the vertical direction (e.g., the third direction D3), a structure SS, which is disposed on the substrate 110 and includes the upper supporter 144P and the lower supporter 142P surrounding the sidewalls of the lower electrode LE1 and supporting the lower electrode LE1, the dielectric layer 160 disposed on the upper supporter 144P and the lower supporter 142P, and the upper electrode UE disposed over the lower electrode LE1 with the dielectric layer 160 therebetween. The liner film 170 may be disposed over the lower electrode trench LE_Tr. The liner film 170 may include portions arranged on respective inner sidewalls of the plurality of holes 144H formed in the upper supporter 144P to be surrounded by the upper supporter 144P. According to some embodiments, the lower electrode trench LE_Tr in which the lower electrode LE1 is disposed may be formed to have a lower portion having a smaller horizontal width than that of an upper portion thereof. In other words, the horizontal width of the upper portion of the lower electrode trench LE_Tr in which the liner film 170 is disposed may be greater than the horizontal width of the lower portion of the lower electrode trench LE_Tr in which the liner film 170 is not disposed. According to some embodiments, even after the liner film 170 is disposed in the upper portion of the lower electrode trench LE_Tr, the horizontal width of the remaining upper portion of the lower electrode trench LE_Tr may be greater than the horizontal width of the lower portion of the lower electrode trench LE_Tr. In other words, the horizontal width L3 of the upper portion of the lower electrode LE1 that covers the liner film 170 and is disposed in the lower electrode trench LE_Tr may be greater than the horizontal width L4 of the lower portion of the lower electrode LE1 that does not cover the liner film 170 and is disposed in the lower electrode trench LE_Tr.

According to some embodiments, the horizontal width of the lower electrode LE1 may include a portion substantially increasing in a direction away from the substrate 110 in the vertical direction (i.e., the third direction D3). For example, as shown in FIGS. 3A to 3C, the lower electrode LE1 may have a trapezoidal cross-section with two parallel sides having different lengths, where one side of the two parallel sides may be positioned on the substrate 110, and the other side may be positioned on a plane parallel to the top surface 110a of the substrate 110. In this case, the length of the one side positioned on the substrate 110 from between the two parallel sides may be less than the length of the other side positioned on the plane parallel to the top surface 110a of the substrate 110. In this case, the horizontal width of the lower electrode LE1 may substantially increase in a direction away from the substrate 110 in the vertical direction (i.e., the third direction D3).

According to some embodiments, a slope of a side surface of the lower portion of the lower electrode LE1 may be different from a slope of a side surface of the upper portion of the lower electrode LE1. In other words, a slope of the side surface of the portion of the lower electrode LE1 surrounded by the liner film 170 may be different from a slope of the side surface of the portion of the lower electrode LE1 not surrounded by the liner film 170.

According to some embodiments, a ratio between the horizontal width of the liner film 170 to a vertical depth H1 of the liner film 170 may be greater than 0 and may be ⅟₈₀ or less. As described above with reference to FIGS. 3B and 3C, the horizontal width of the liner film 170 may not be uniform. For example, a point corresponding to the largest horizontal width of the liner film 170 may be positioned farther from the substrate 110 than a point corresponding to the smallest horizontal width of the liner film 170, and the horizontal width of the liner film 170 may substantially increase in a direction away from the substrate 110 in the vertical direction (i.e., the third direction D3). According to some embodiments, a ratio between the largest horizontal width L1 of the liner film 170 to the vertical depth H1 of the liner film 170 may be greater than 0 and may be about ⅟₈₀ or less. The vertical depth H1 of the liner film 170 may refer to the distance between the top surface 170_T of the liner film 170 to the point corresponding to the smallest horizontal width of the liner film 170 in the vertical direction (i.e., the third direction D3).

According to some embodiments, at least some of side surfaces of the liner film 170 (i.e., a first side surface 170_S1 and a second side surface 170_S2) may have a slope different from that of a side surface LE1_S of the lower electrode LE1. The first side surface 170_S1 of the liner film 170 may be an inner side surface of the liner film 170 contacting the lower electrode LE1, and the second side surface 170_S2 of the liner film 170 may be an outer side surface of the liner film 170 contacting the upper supporter 144P. For example, as shown in FIG. 3B, the first side surface 170_S1 of the liner film 170 may have the same slope as the side surface LE1_S of the lower electrode LE1, and the second side surface 170_S2 of the liner film 170 may have a slope different from that of the side surface LE1_S of the lower electrode LE1. Alternatively, as shown in FIG. 3D, the first side surface 170_S1 of the liner film 170 may have a slope different from that of the side surface LE1_S of the lower electrode LE1, and the second side surface 170_S2 of the liner film 170 may have the same slope as the side surface LE1_S of the lower electrode LE1.

The semiconductor device 100 according to embodiments may include the liner film 170 that surrounds the upper portion of the lower electrode LE1 and is surrounded by the upper supporter 144P. A top/bottom (T/B) ratio of the lower electrode LE1 may be improved by the liner film 170. The T/B ratio of the lower electrode LE1 may refer to a ratio between the horizontal thickness of the upper portion of the lower electrode LE1 and the horizontal thickness of the lower portion of the lower electrode LE1. During a process of manufacturing the semiconductor device 100, the lower electrode trench LE_Tr having an upper width greater than a lower width may be formed. When the lower electrode LE1 is deposited in the lower electrode trench LE_Tr having the upper width greater than the lower width, the lower electrode LE1 having an upper width greater than a lower width is formed. Therefore, the T/B ratio of the lower electrode LE1 may be improved by depositing the liner film 170 only on the upper portion of the lower electrode trench LE_Tr having the upper width greater than the lower width.

Also, the liner film 170 of the semiconductor device 100 according to embodiments may include the second metal nitride containing nitrogen atoms at a higher ratio than the lower electrode LE1, where the second metal nitride containing nitrogen atoms at a higher ratio than the lower electrode LE1 may function as an insulator and increase an insulation distance of the lower electrode LE1 from adjacent lower electrodes LE1 to reduce leakage of a current.

The liner film 170 of the semiconductor device 100 according to embodiments is formed on the upper supporter 144P by using a deposition method with improved step coverage. As a result, the phenomenon like formation of a seam inside the lower electrode LE1 during deposition of the lower electrode LE1 as the opening of the lower electrode trench LE_Tr is blocked or narrowed due to excessive deposition of the liner film 170 only on the upper portion of the lower electrode trench LE_Tr may be prevented.

Figure 4A:
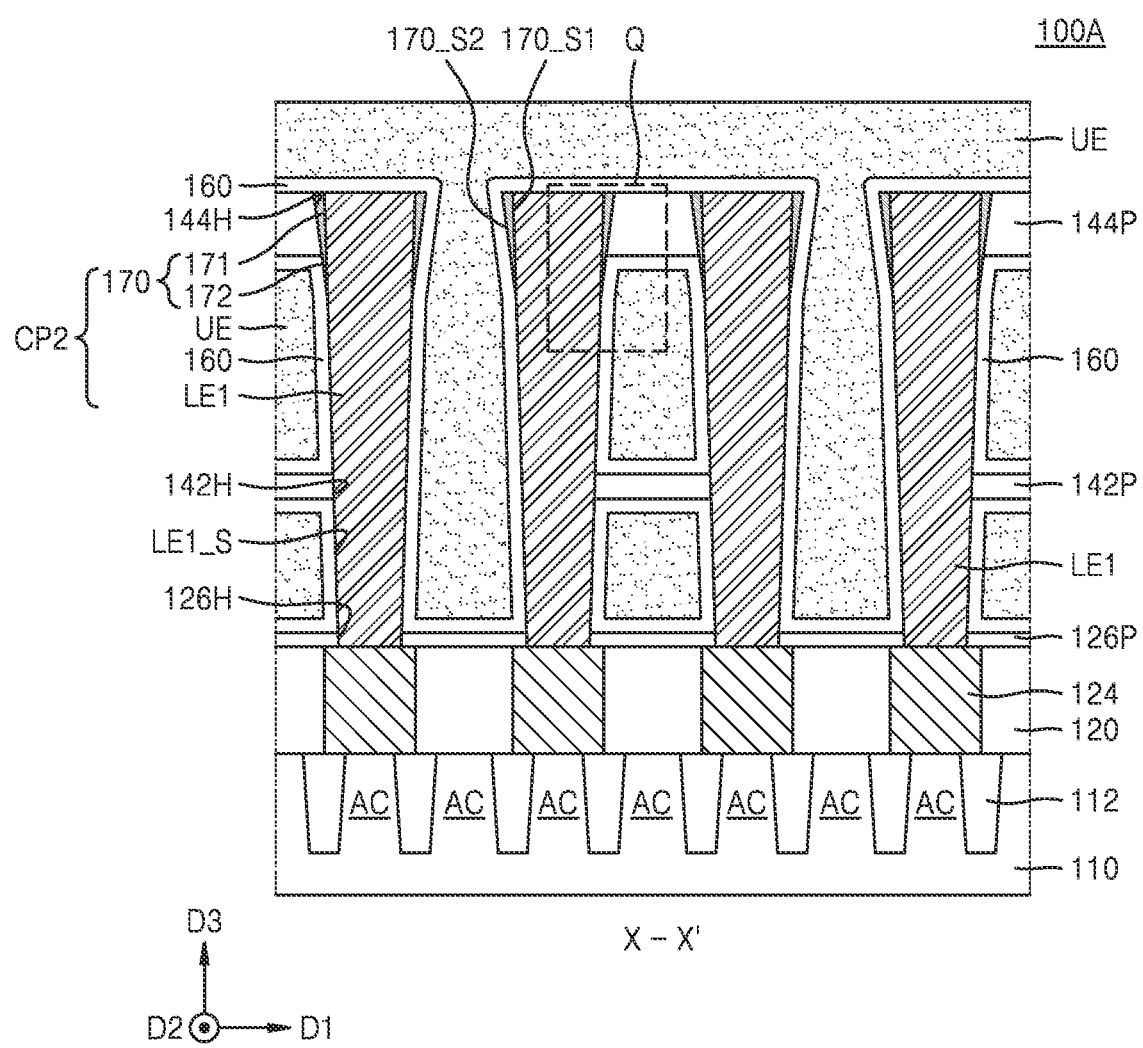
FIG. 4A is a cross-sectional view of an example of a structure of a semiconductor device according to an example embodiment.
Figure 4B:
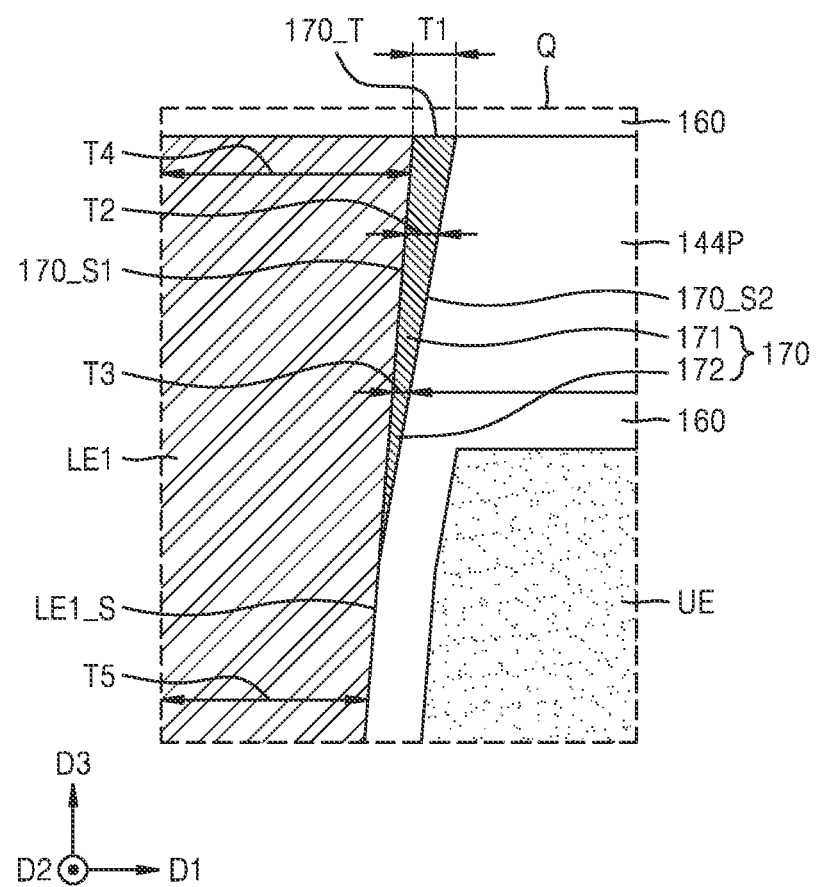
FIG. 4B is a cross-sectional view of a region Q of FIG. 4A according to an example embodiment.
Figure 4C:
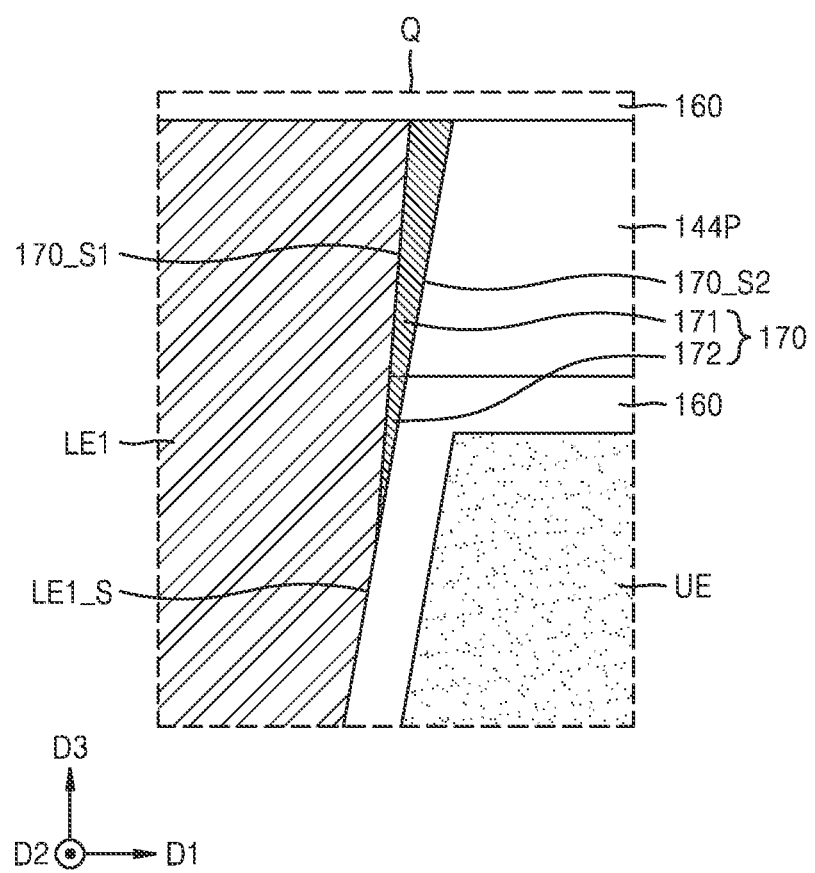
FIG. 4C is a cross-sectional view of an example of a structure of the region Q shown in FIG. 4B according to an example embodiment.

FIG. 4A is a cross-sectional view of an example of a structure of a semiconductor device according to an example embodiment. FIG. 4B is a cross-sectional view of a region Q of FIG. 4A according to an example embodiment. FIG. 4C is a cross-sectional view of an example of a structure of the region Q shown in FIG. 4B according to an example embodiment.

Referring to FIGS. 4A and 4B, the liner film 170 may include a portion 171 contacting the upper supporter 144P and surrounded by the upper supporter 144P and a portion 172 contacting the dielectric layer 160 and disposed between the dielectric layer 160 and the lower electrode LE1. The portion 172 contacting the dielectric layer 160 and disposed between the dielectric layer 160 and the lower electrode LE1 may be formed as the second metal nitride is deposited to a level lower than the upper supporter 144P during deposition of the second metal nitride for forming the liner film 170.

The liner film 170 may be formed, such that the upper portion of the liner film 170 has a width greater than that of the lower portion of the liner film 170. For example, the horizontal width of the portion 171 contacting the upper supporter 144P and surrounded by the upper supporter 144P may be greater than the horizontal width of the portion 172 contacting the dielectric layer 160 and disposed between the dielectric layer 160 and the lower electrode LE1. The largest horizontal width of the liner film 170 may be T1, and a point at which the liner film 170 has the largest horizontal width may be the top surface 170_T of the liner film 170. When the liner film 170 may include the portion 172 contacting the dielectric layer 160 and disposed between the dielectric layer 160 and the lower electrode LE1, the largest horizontal width of the portion 172 contacting the dielectric layer 160 and disposed between the dielectric layer 160 and the lower electrode LE1 may be T3, which may be smaller than a horizontal width T2 of the portion 171 surrounded by the upper supporter 144P.

According to some embodiments, even when the liner film 170 includes the portion 171 contacting the upper supporter 144P and surrounded by the upper supporter 144P and the portion 172 contacting the dielectric layer 160 and disposed between the dielectric layer 160 and the lower electrode LE1, a horizontal width T4 of the upper portion of the lower electrode LE1 surrounded by the liner film 170 may be greater than a horizontal width T5 of the lower portion of the lower electrode LE1 not surrounded by the liner film 170. In other words, the lower electrode LE1 may be formed, such that the horizontal width T4 of the upper portion of the lower electrode LE1 is greater than the horizontal width T5 of the lower portion of the lower electrode LE1.

According to some embodiments, when the liner film 170 includes the portion 171 contacting the upper supporter 144P and surrounded by the upper supporter 144P and the portion 172 contacting the dielectric layer 160 and disposed between the dielectric layer 160 and the lower electrode LE1, the largest horizontal width T1 of the portion 171 of the liner film 170 surrounded by the upper supporter 144P may be from about 0.5 nm to about 1.5 nm. In other words, the largest distance between the lower electrode LE1 and the upper supporter 144P in a horizontal direction may be from about 0.5 nm to about 1.5 nm. Also, according to some embodiments, the largest horizontal width T3 of the portion 172 of the liner film 170 contacting the dielectric layer 160 and disposed between the dielectric layer 160 and the lower electrode LE1 may be greater than 0 nm and may be about 0.75 nm or less. However, as described above, the horizontal width of the portion 171 contacting the upper supporter 144P and surrounded by the upper supporter 144P may be greater than the horizontal width of the portion 172 contacting the dielectric layer 160 and disposed between the dielectric layer 160 and the lower electrode LE1. Thus, when the largest horizontal width T3 of the portion 172 contacting the dielectric layer 160 and disposed between the dielectric layer 160 and the lower electrode LE1 is about 0.75 nm, the largest horizontal width T1 of the portion 171 contacting the upper supporter 144P and surrounded by the upper supporter 144P may have a value that is greater than 0.75 nm and is about 1.5 nm or less.

Referring to FIGS. 4B and 4C together, when the liner film 170 includes the portion 171 contacting the upper supporter 144P and surrounded by the upper supporter 144P and the portion 172 contacting the dielectric layer 160 and disposed between the dielectric layer 160 and the lower electrode LE1, at least some of side surfaces (i.e., the first side surface 170_S1 and the second side surface 170_S2 of the liner film 170) may have a slope different from that of the side surface LE1_S of the lower electrode LE1. For example, as shown in FIG. 4B, the first side surface 170_S1 of the liner film 170 may have the same slope as the side surface LE1_S of the lower electrode LE1, and the second side surface 170_S2 of the liner film 170 may have a slope different from that of the side surface LE1_S of the lower electrode LE1. Alternatively, as shown in FIG. 4C, the first side surface 170_S1 of the liner film 170 may have a slope different from that of the side surface LE1_S of the lower electrode LE1, and the second side surface 170_S2 of the liner film 170 may have the same slope as the side surface LE1_S of the lower electrode LE1.

Figure 5A:
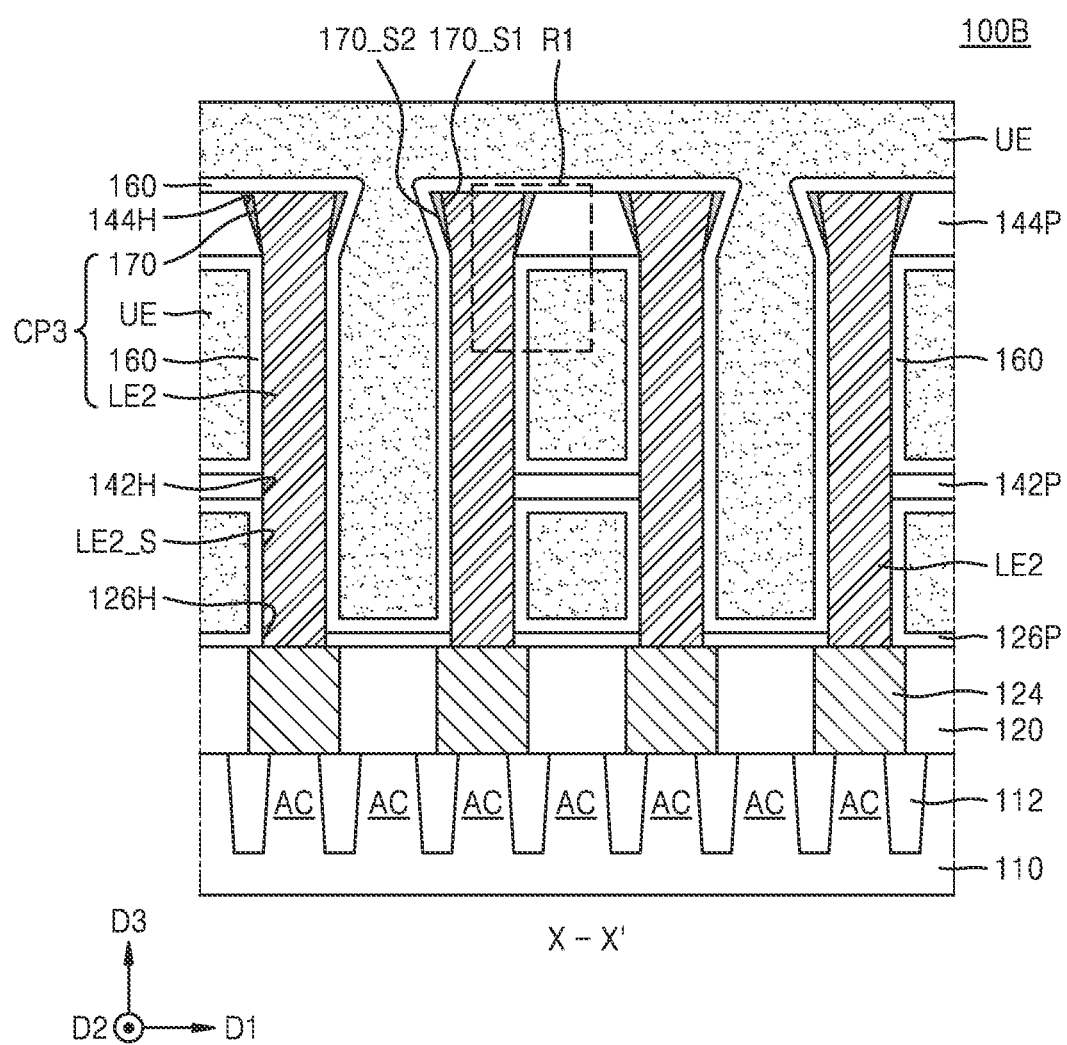
FIG. 5A is a cross-sectional view of an example of a structure of a semiconductor device according to an example embodiment.
Figure 5B:
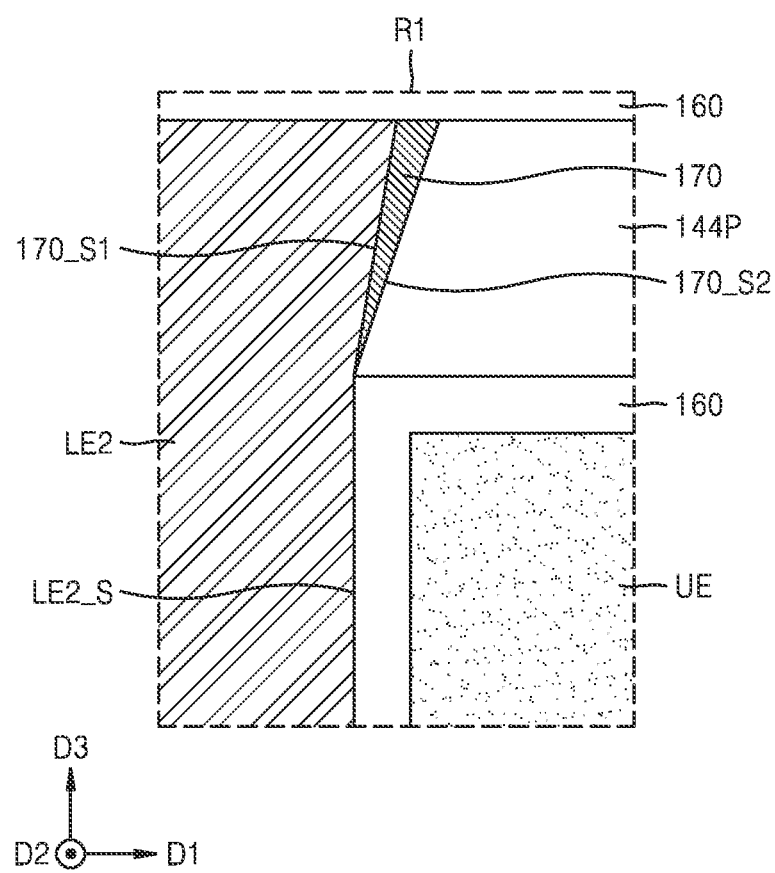
FIG. 5B is a cross-sectional view of a region R1 of FIG. 5A according to an example embodiment.

FIG. 5A is a cross-sectional view of an example of a structure of a semiconductor device 100B according to an example embodiment. FIG. 5B is a cross-sectional view of a region R1 of FIG. 5A according to an example embodiment.

Referring to FIGS. 5A and 5B, a lower electrode LE2 may include a portion in which a sidewall LE2_S is perpendicular to the substrate 110. The portion of the lower electrode LE2 in which the sidewall LE2_S is perpendicular to the substrate 110 may have a rectangular cross-section unlike that described with reference to FIGS. 3A to 3D. At the same time, the lower electrode LE2 may include a portion in which the horizontal width of the lower electrode LE2 increases in a vertical direction away from the substrate 110 (i.e., the third direction D3). The portion of the lower electrode LE2 may have a trapezoidal cross-section similar to that described with reference to FIGS. 3A to 3D.

According to some embodiments, at least some of side surfaces of the liner film 170 (i.e., the first side surface 170_S and the second side surface 170_S2) may have a slope different from that of a side surface LE2_S of the lower electrode LE2. In particular, as shown in FIGS. 5A and 5B, when the lower electrode LE2 may include the portion perpendicular to the substrate 110, both side surfaces (i.e., the first side surface 170_S1 and the second side surface 170_S2) of the liner film 170 may have slopes different from that of the side surface LE2S of the lower electrode LE2.

Figure 6A:
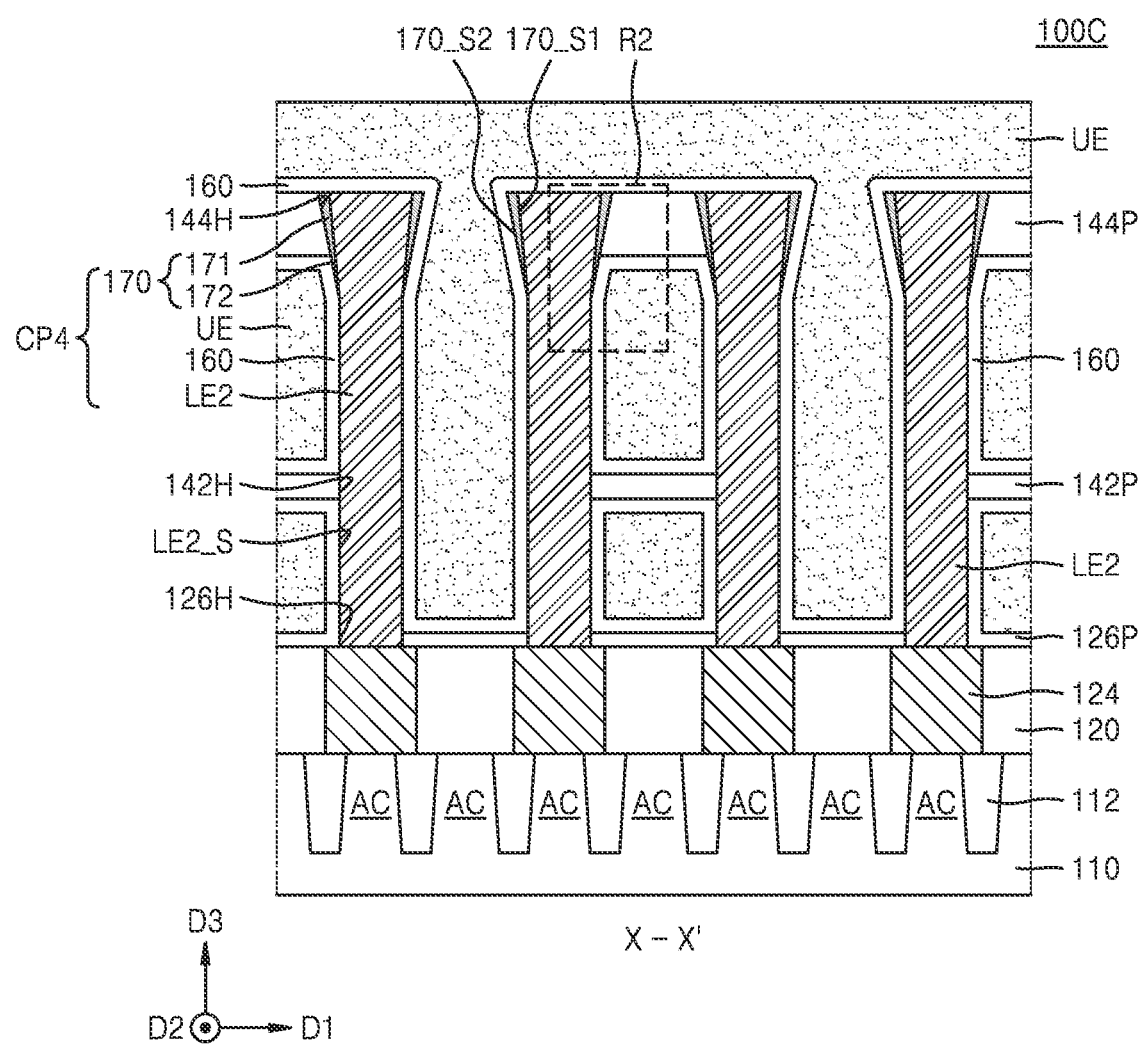
FIG. 6A is a cross-sectional view of an example of a structure of a semiconductor device according to an example embodiment.
Figure 6B:
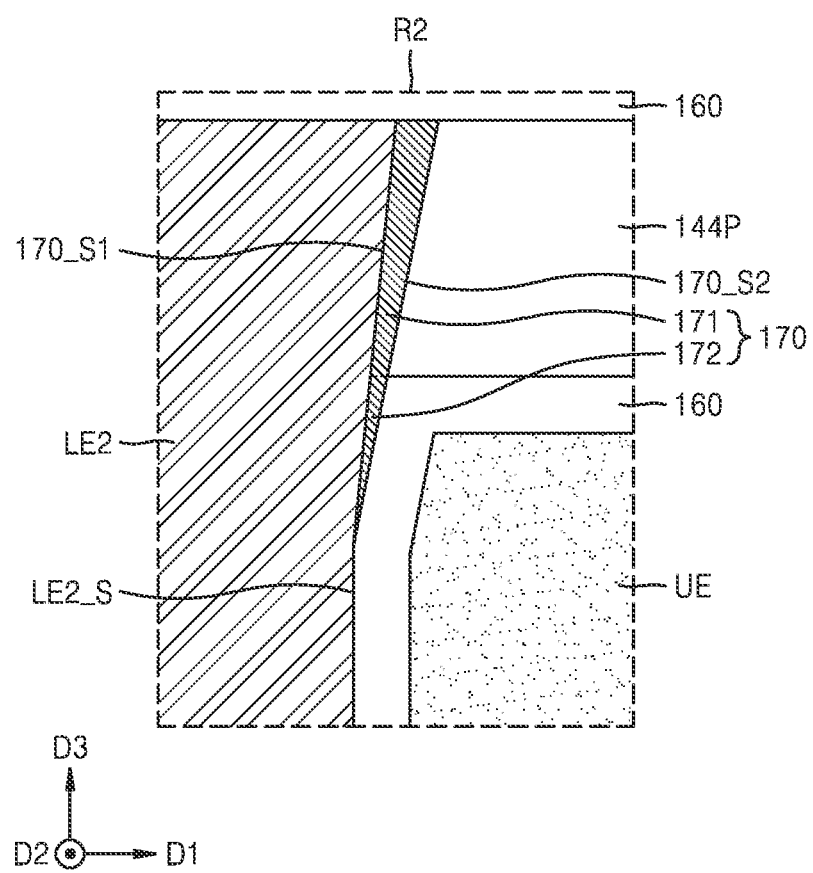
FIG. 6B is a cross-sectional view of a region R2 of FIG. 6A according to an example embodiment.

FIG. 6A is a cross-sectional view of an example of a structure of a semiconductor device according to an example embodiment. FIG. 6B is a cross-sectional view of a region R2 of FIG. 6A according to an example embodiment.

Referring to FIGS. 6A and 6B, the liner film 170 may include the portion 171 contacting the upper supporter 144P and surrounded by the upper supporter 144P and the portion 172 contacting the dielectric layer 160 and disposed between the dielectric layer 160 and the lower electrode LE2. Also, according to some embodiments, at least some of side surfaces of the liner film 170 (i.e., the first side surface 170_S and the second side surface 170_S2) may have a slope different from that of a side surface LE2_S of the lower electrode LE2. In particular, as shown in FIGS. 6A and 6B, when the side surface LE2_S of the lower electrode LE2 may include the portion perpendicular to the substrate 110, both side surfaces (i.e., the first side surface 170_S1 and the second side surface 170_S2) of the liner film 170 may have slopes different from that of the side surface LE2_S of the lower electrode LE2.

FIGS. 7A, 7B, 7C, 7D, 7E, 7F, 7G, 7H and 7I are cross-sectional views of a method of manufacturing a semiconductor device, according to an example embodiment. In FIGS. 7A to 7I, the same reference numerals as those in FIGS. 1 to 6B denote the same members, and detailed descriptions thereof will be omitted below.

Figure 7A:
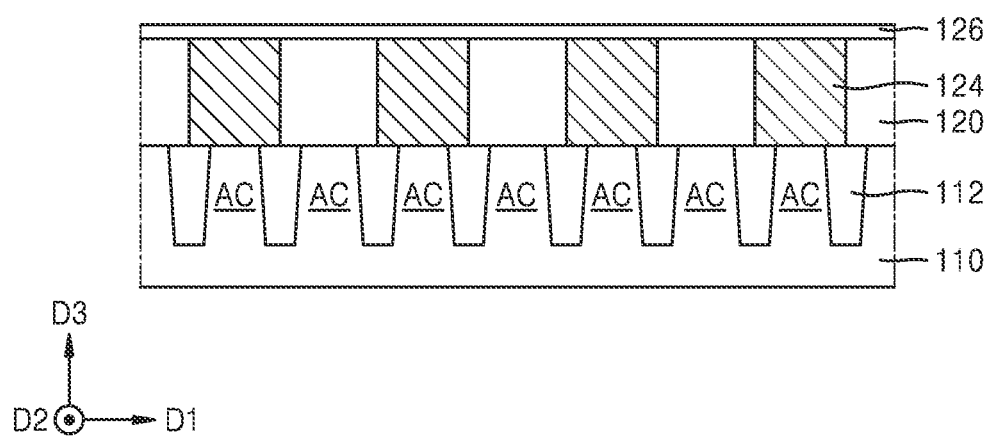
FIGS. 7A, 7B, 7C, 7D, 7E, 7F, 7G, 7H and 7I are cross-sectional views of a method of manufacturing a semiconductor device, according to an example embodiment.

Referring to FIG. 7A, the lower structure 120 and the conductive region 124, which penetrates through the lower structure 120 and is connected to the active region AC, may be formed on the substrate 110 in which the active region AC is defined by the device isolation layer 112. Next, an insulation film 126 covering the lower structure 120 and the conductive region 124 may be formed.

The insulation film 126 may be used as an etch stop layer in subsequent processes. The insulation film 126 may include an insulating material having an etch selectivity with respect to the lower structure 120. According to some embodiments, the insulation film 126 may include a SiN film, a SiCN film, a SiBN film, or a combination thereof.

Figure 7B:
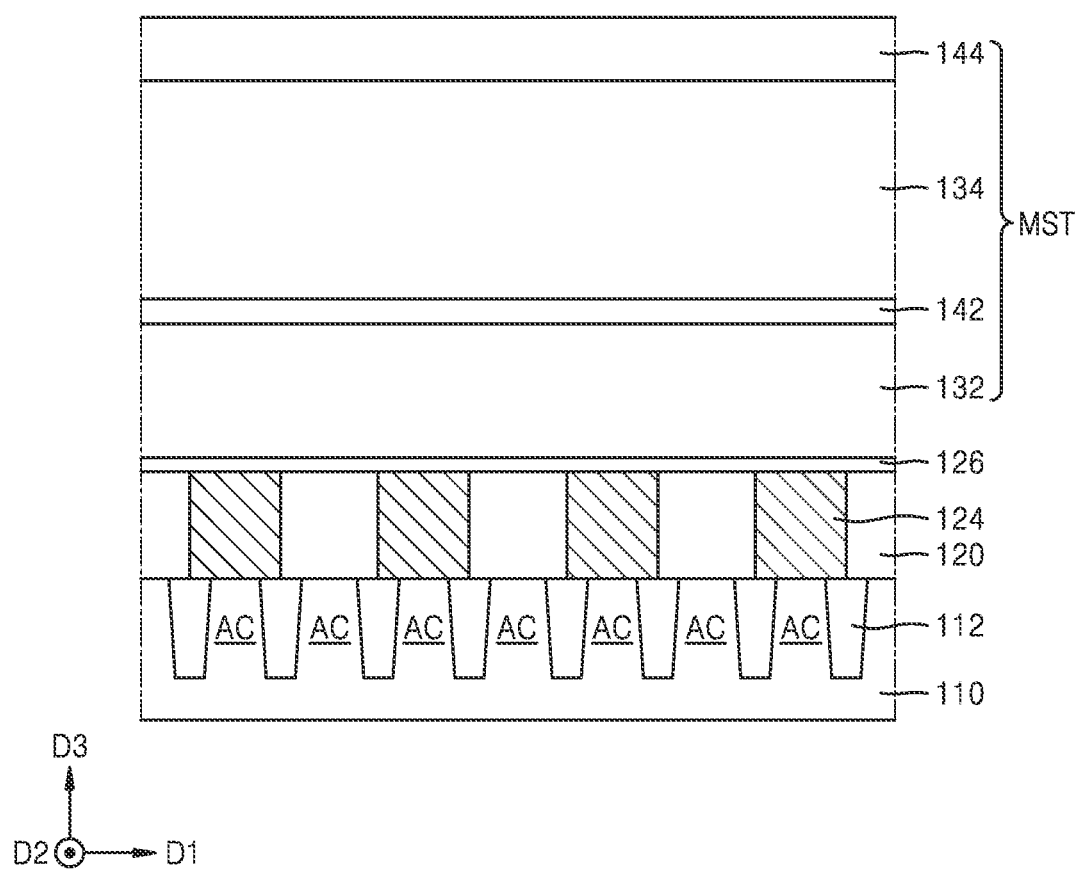

Referring to FIG. 7B, a mold structure MST may be formed on the insulation film 126. The mold structure MST may include a plurality of mold films and a plurality of supporter films. For example, the mold structure MST may include a first mold film 132, a lower supporter film 142, a second mold film 134, and an upper supporter film 144 sequentially stacked on the insulation film 126. The first mold film 132 and the second mold film 134 may each include a material that may be removed through a lift-off process using an etchant containing ammonium fluoride (NH$_4$F), hydrofluoric acid (HF), and water due to a relatively high etching rate with respect to the etchant. According to some embodiments, the first mold film 132 and the second mold film 134 may each include an oxide film, a nitride film, or a combination thereof. For example, the first mold film 132 may include a boro phosphor silicate glass (BPSG) film. The BPSG film may include at least one of a first portion in which a concentration of boron (B), which is a dopant, varies in the thickness-wise direction of the BPSG film and a second portion in which a concentration of phosphorus (P), which is a dopant, varies in the thickness direction of the BPSG film. The second mold film 134 may include a multiple insulating film in which relatively thin silicon oxide films and relatively thin silicon nitride films are alternately stacked a plurality of number of times or a silicon nitride film. However, the materials constituting the first mold film 132 and the second mold film 134 are not limited to the examples stated above, and various modifications and variations are possible within the scope of the disclosure. Also, the stacking order of the mold structure MST is not limited to that shown in FIG. 7B, and various modifications and variations are possible within the scope of the disclosure.

The lower supporter film 142 and the upper supporter film 144 may each include a SiN film, a SiCN film, a SiBN film, or a combination thereof. According to embodiments, the lower supporter film 142 and the upper supporter film 144 may include the same material. According to some embodiments, the lower supporter film 142 and the upper supporter film 144 may include different materials. According to some embodiments, the lower supporter film 142 and the upper supporter film 144 may each include a SiCN film. According to some embodiments, the lower supporter film 142 may include a SiCN film, whereas the upper supporter film 144 may include a boron-containing SiN film. However, the materials constituting the lower supporter film 142 and the upper supporter film 144 are not limited to the examples stated above, and various modifications and variations are possible within the scope of the disclosure.

Figure 7C:
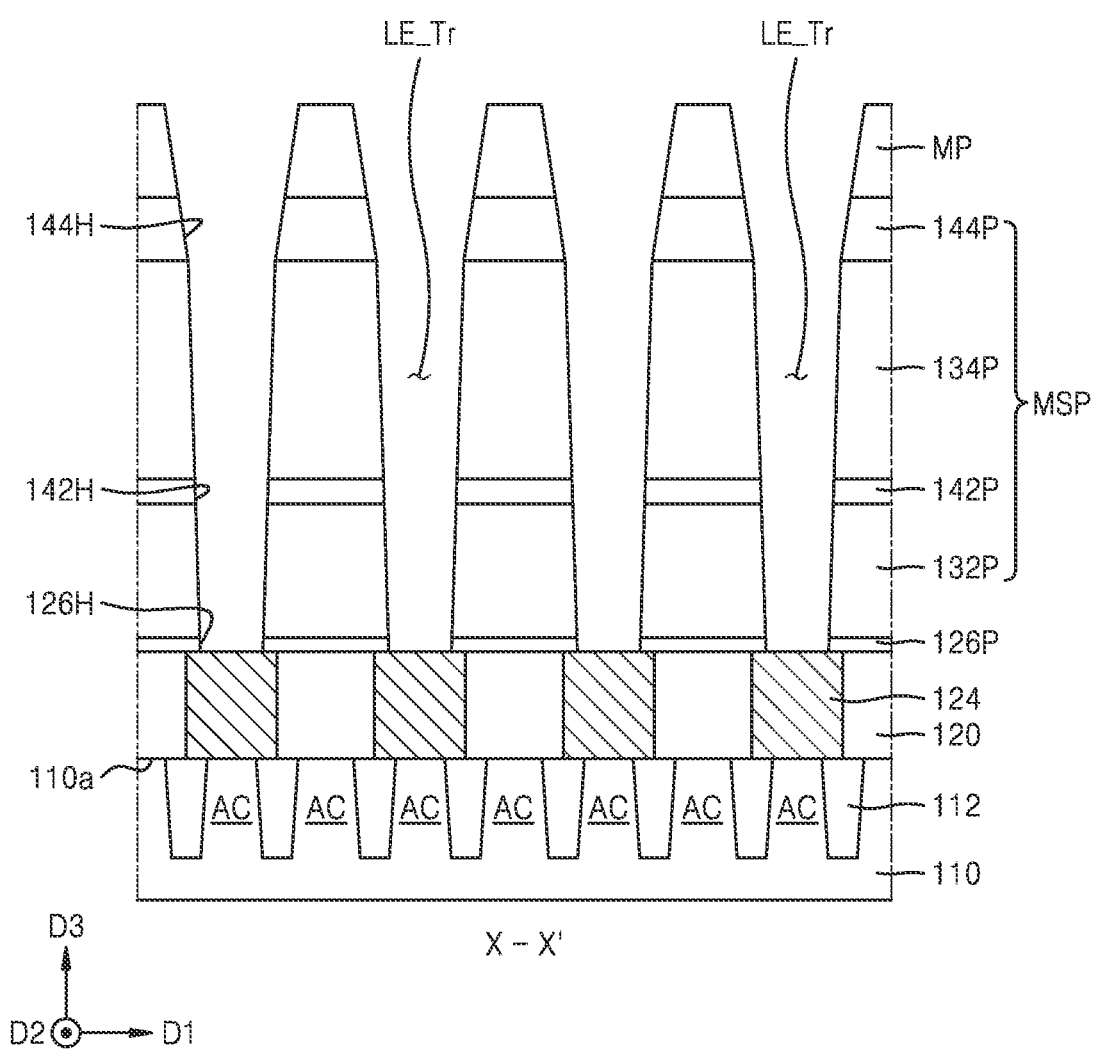

Referring to FIG. 7C, after forming a mask pattern MP on the mold structure MST in a result structure of FIG. 7B, a mold structure pattern MSP that limits the lower electrode trench LE_Tr may be formed by anisotropically etching the mold structure MST by using the mask pattern MP as an etching mask and using the insulation film 126 as an etch stop layer. The mold structure pattern MSP may include the first mold pattern 132P, the lower supporter 142P, the second mold pattern 134P, and the upper supporter 144P.

The mask pattern MP may include a nitride film, an oxide film, a polysilicon film, a photoresist film, or a combination thereof.

The process of forming the lower electrode trench LE_Tr may further include a process of wet-processing a result structure obtained by anisotropically etching the mold structure MST. During the process of anisotropically etching the mold structure MST and wet-processing the result structure thereof, the insulation film 126 may also be partially etched, and thus the insulation pattern 126P having the plurality of holes 126H exposing the plurality of conductive regions 124 may be obtained. In an example process of wet-processing the result structure of anisotropically etching the mold structure MST, an etchant including a diluted sulfuric acid peroxide (DSP) solution may be used, but embodiments of the disclosure are not limited thereto.

In the mold structure pattern MSP, the plurality of holes 142H, which are a part of the lower electrode trench LE_Tr, may be formed in the lower supporter 142P, and the plurality of holes 144H, which are a part of the lower electrode trench LE_Tr, may be formed in the upper supporter 144P.

Figure 7D:
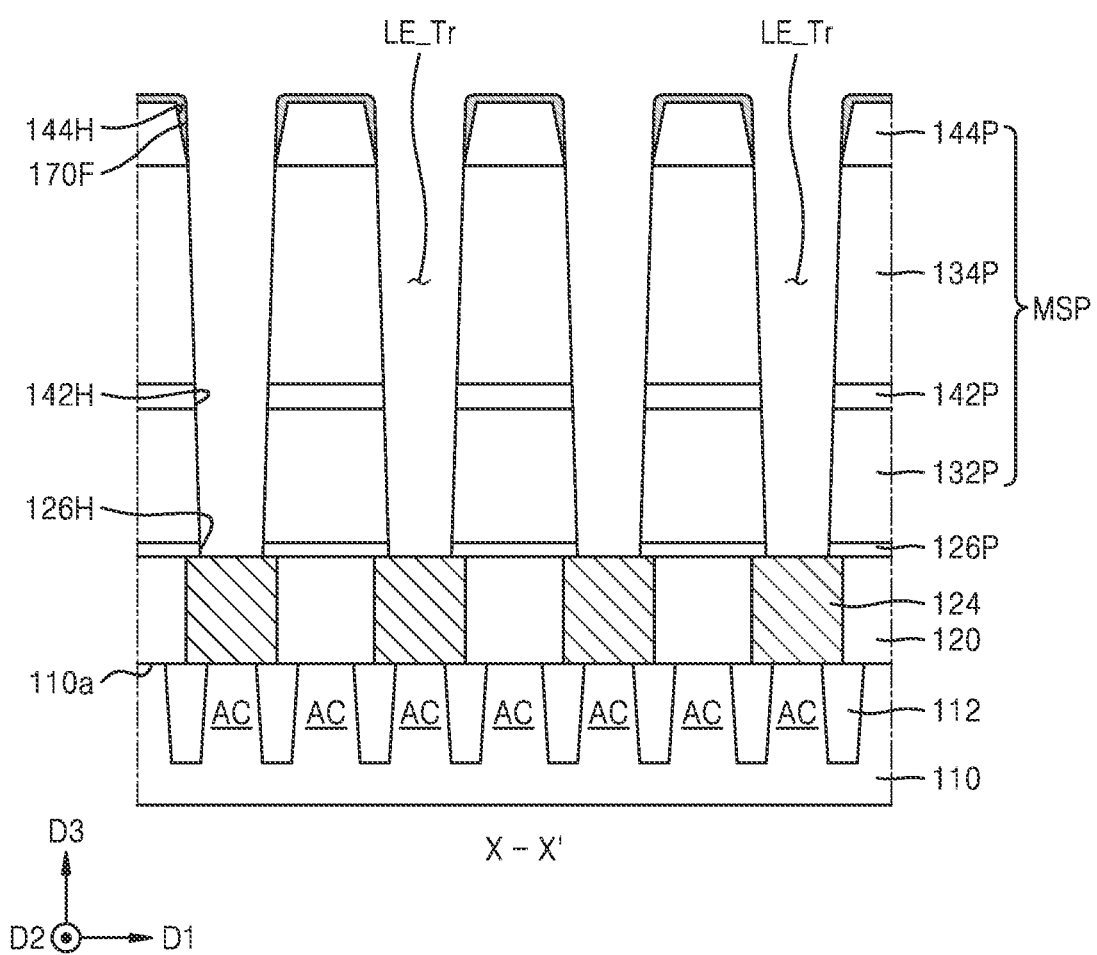

Referring to FIG. 7D, a pre-liner film 170F may be formed in the lower electrode trench LE_Tr formed in FIG. 7D.

According to embodiments, a second metal nitride may be applied onto the lower electrode trench LE_Tr (i.e., onto the upper supporter 144P to form the pre-liner film 170F). The application of the second metal nitride may be performed through a chemical vapor deposition (CVD) process, a plasma enhanced chemical vapor deposition (PECVD) process, a metal organic CVD (MOCVD) process, or an atomic layer deposition (ALD) process. In detail, the application of the second metal nitride may be performed through an ALD process.

Figure 7E:
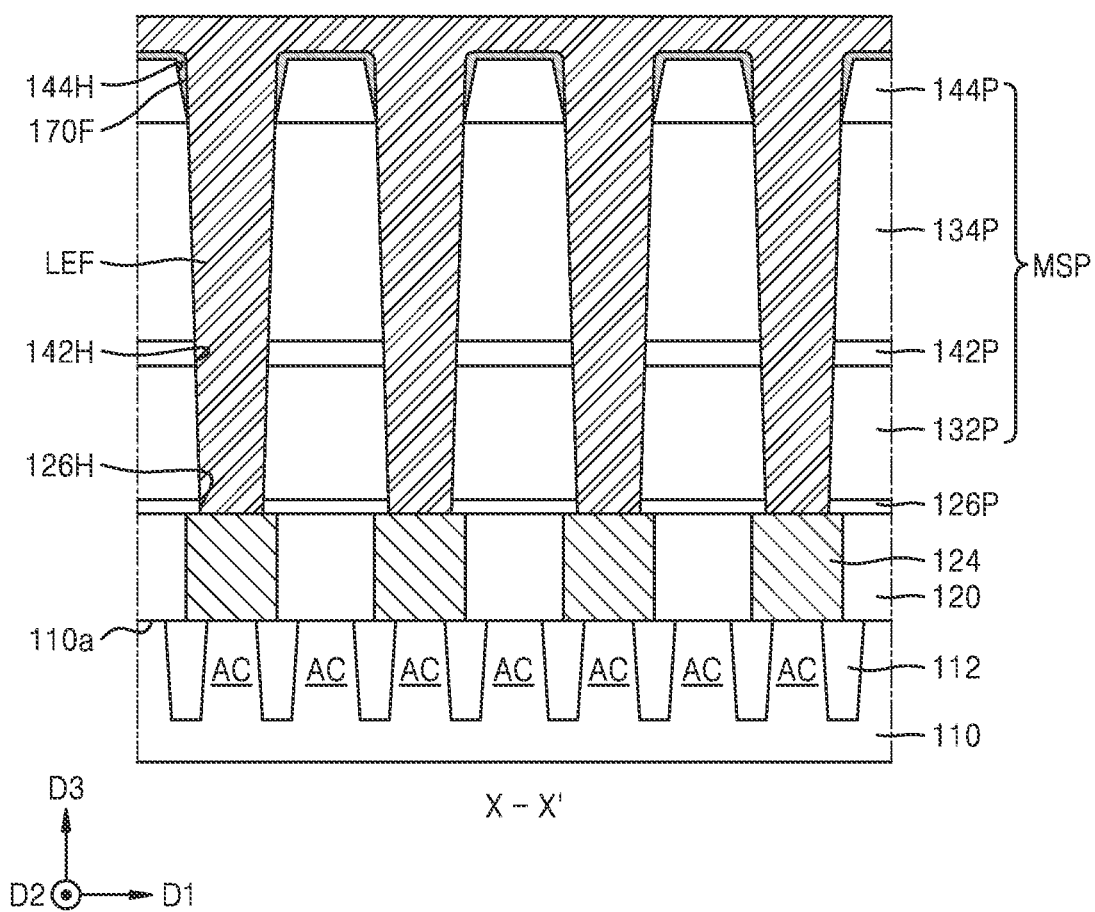

Referring to FIG. 7E, in the result structure of FIG. 7D, a pre-lower electrode LEF may be formed on the pre-liner film 170F while filling the lower electrode trench LE_Tr. A first metal nitride may be applied to form the pre-lower electrode LEF, and a CVD process, a PECVD process, an MOCVD process, or an ALD process may be used to apply the first metal nitride. Specifically, the pre-lower electrode LEF may be applied by using the same coating method as that used to apply the pre-liner film 170F.

Figure 7F:
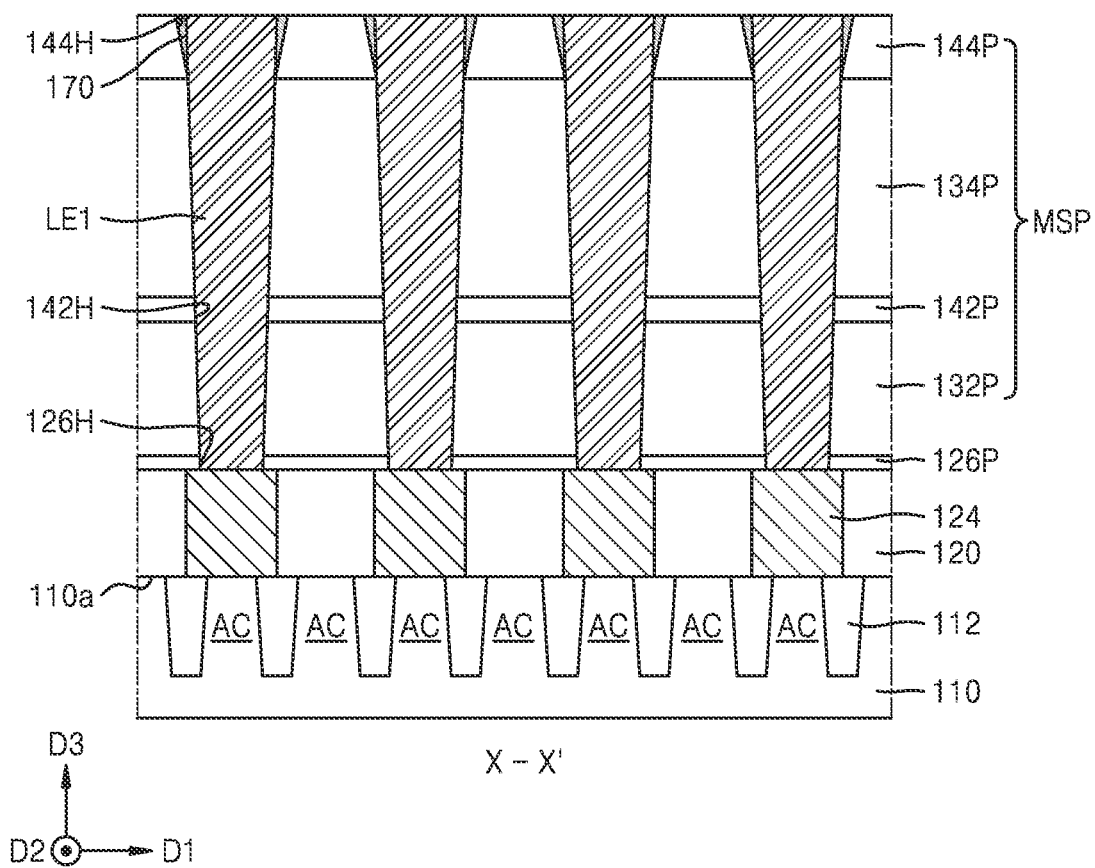

Referring to FIG. 7F, after the pre-liner film 170F and the pre-lower electrode LEF are applied, a portion of the pre-liner film 170F and the pre-lower electrode LEF may be removed through an etchback process or a chemical mechanical polishing (CMP) process, thereby exposing the top surface of the upper supporter 144P. Therefore, the liner film 170 and the lower electrode LE1 may be formed, and the top surface of the liner film 170 may be positioned on the same plane as the top surface of the lower electrode LE1.

Figure 7G:
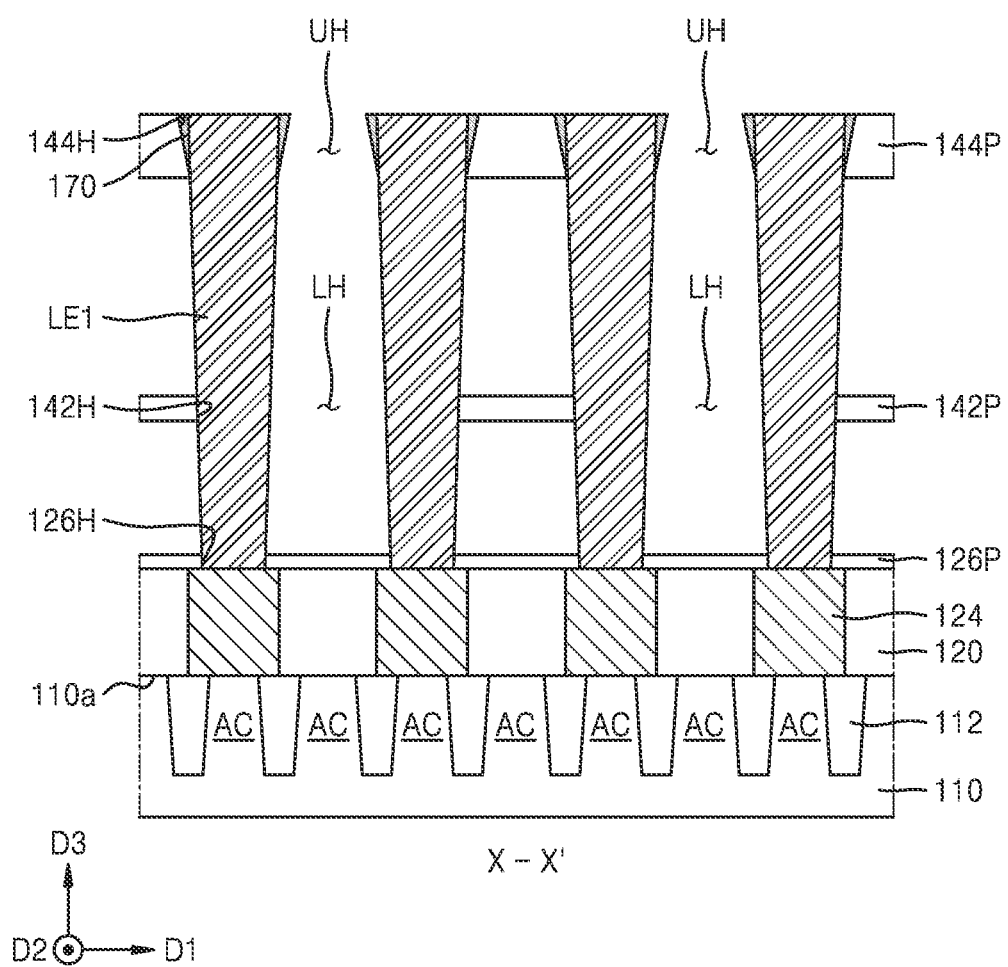

Referring to FIG. 7G, after forming the plurality of upper holes UH by partially removing the upper supporter 144P in the result structure of FIG. 7F, the second mold pattern 134P may be wet-removed through the plurality of upper holes UH. Next, after forming the plurality of lower holes LH by removing portions of the lower supporter 142P exposed by the plurality of upper holes UH, the first mold pattern 132P may be wet-removed through the plurality of lower holes LH, thereby exposing the top surface of the insulation pattern 126P. After the first mold pattern 132P and the second mold pattern 134P are removed, sidewalls of the plurality of lower electrodes LE1 may be exposed.

According to embodiments, an etchant containing $NH_4F$, HF, and water may be used to wet-remove the second mold pattern 134P and the first mold pattern 132P, but the disclosure is not limited thereto.

Figure 7H:
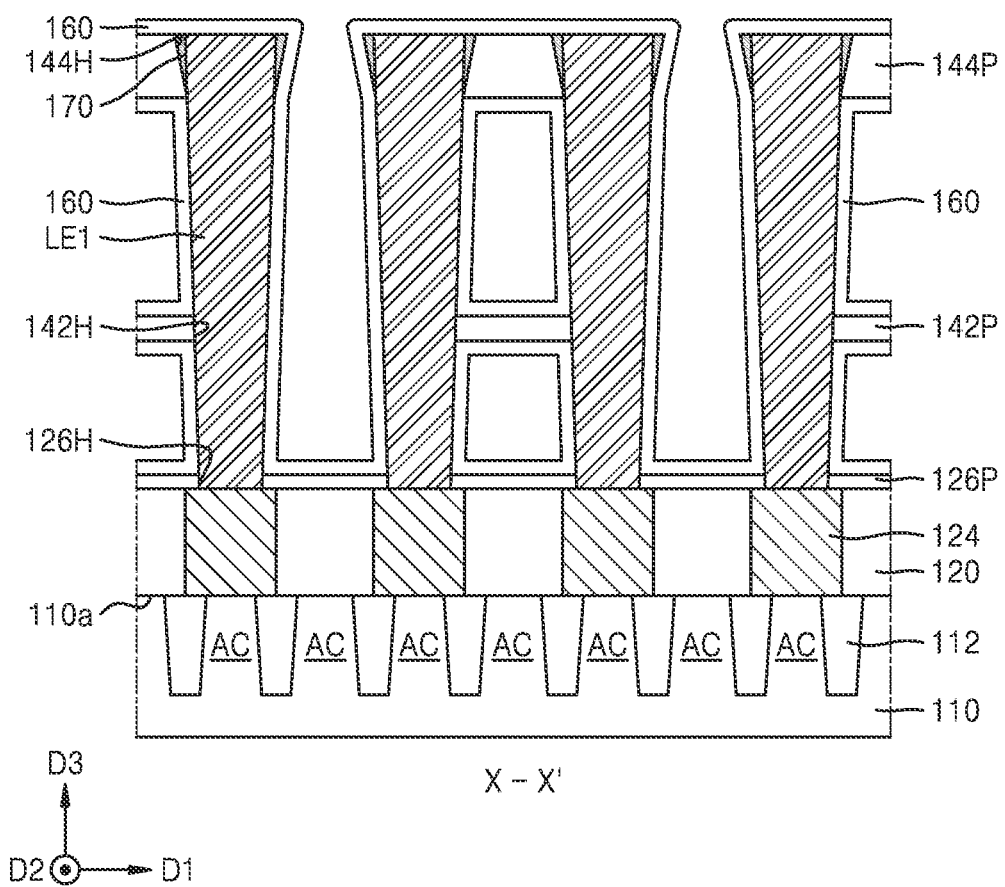

Referring to FIG. 7H, a process of forming the dielectric layer 160 covering the lower electrode LE1 exposed in the result structure of FIG. 7G may be performed. The dielectric layer 160 covering not only the sidewalls of the lower electrode LE1, but also exposed surfaces of the lower supporter 142P and the upper supporter 144P and exposed surfaces of the insulation pattern 126P may be formed. To form the dielectric layer 160, a CVD, MOCVD, PVD, or ALD process may be used. After the process of depositing the dielectric layer 160 covering the lower electrode LE1 is performed, an annealing process may be performed. According to embodiments, the annealing process may be performed at a temperature from about 200° C. to about 700° C. Crystallinity of the dielectric layer 160 may be improved by the annealing process that may be performed in a state that the dielectric layer 160 is formed.

Figure 7I:
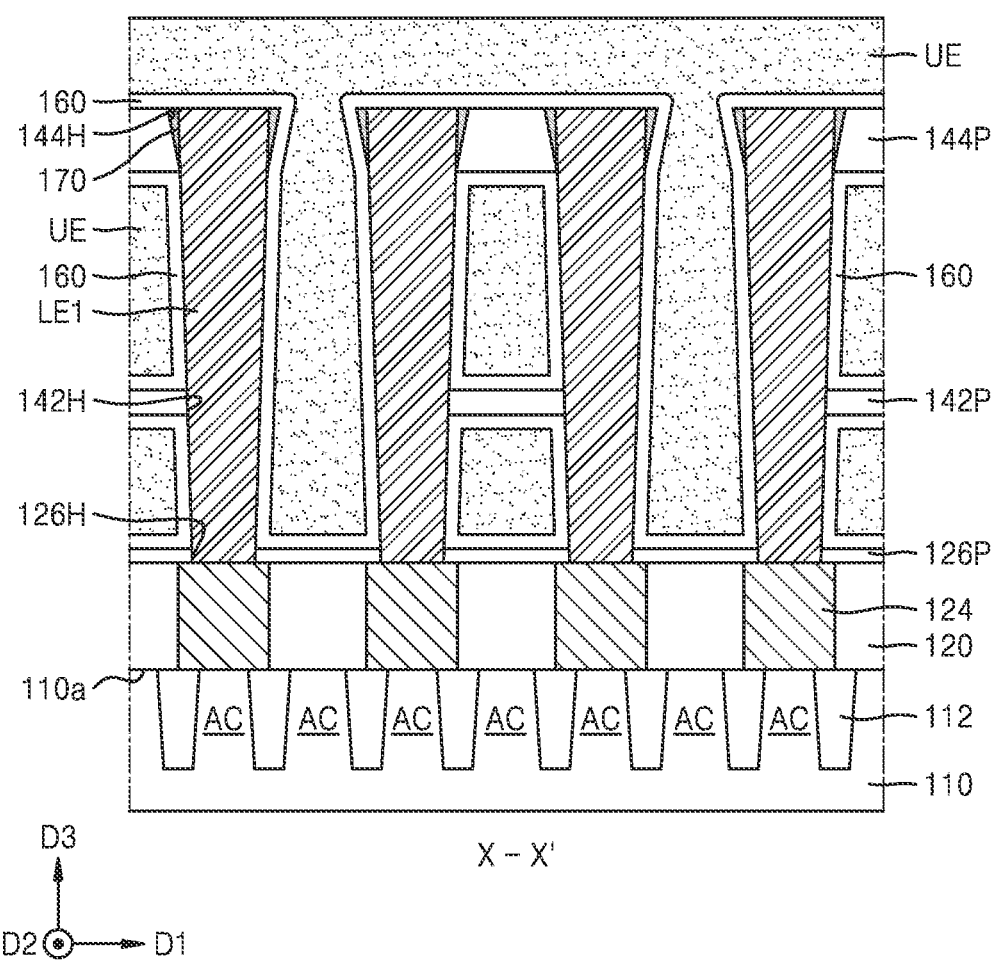

Referring to FIG. 7I, a process of forming the upper electrode UE covering the dielectric layer 160 may be performed in the result structure of FIG. 7H. Through the process stated above, a plurality of capacitors each including the lower electrode LE1 extending in the third direction D3 perpendicular to a top surface 110a of the substrate 110, the lower supporter 142P and the upper supporter 144P surrounding sidewalls of the lower electrode LE1 and supporting the lower electrode LE1, the dielectric layer 160 disposed over the lower electrode LE1 and the lower supporter 142P and the upper supporter 144P, the upper electrode UE spaced apart from the lower electrode LE1 with the dielectric layer 160 therebetween, and a liner film 170 disposed between the lower electrode LE1 and the upper supporter 144P and surrounding the upper portion of the lower electrode LE1 and the semiconductor device 100 including the plurality of capacitors may be manufactured.

Figure 8A:
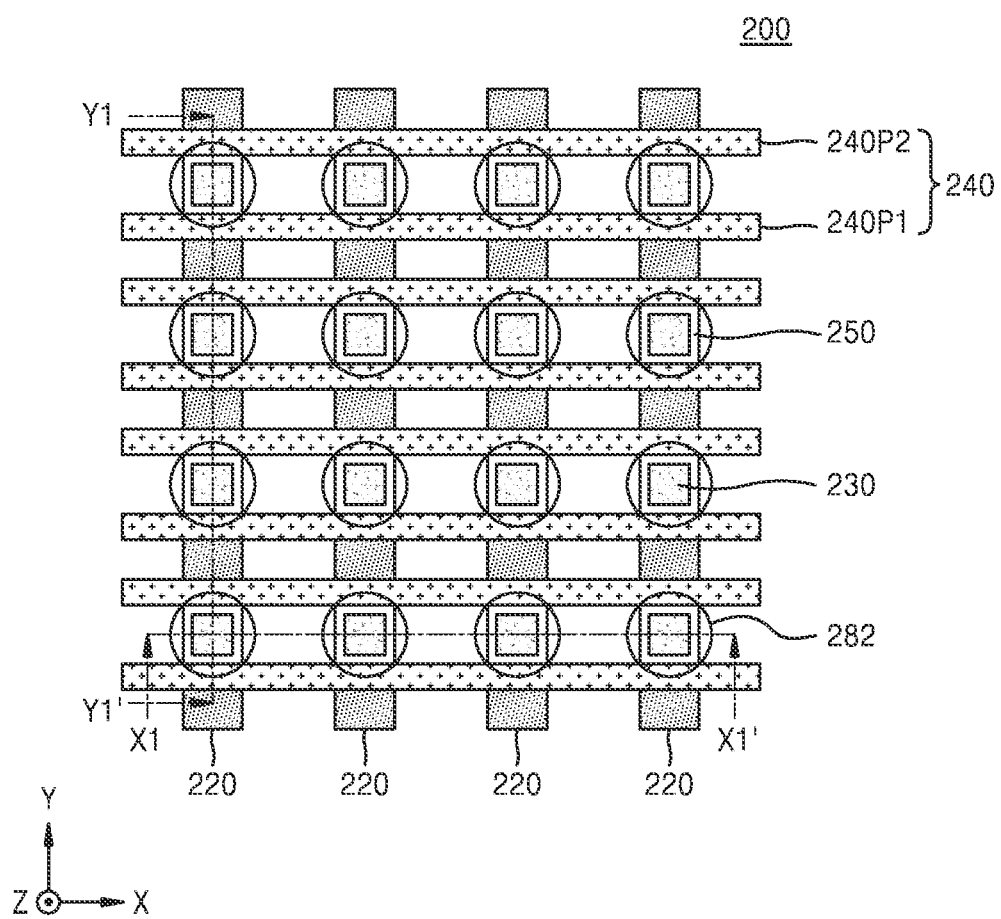
FIG. 8A is a diagram of a semiconductor device according to an example embodiment.
Figure 8B:
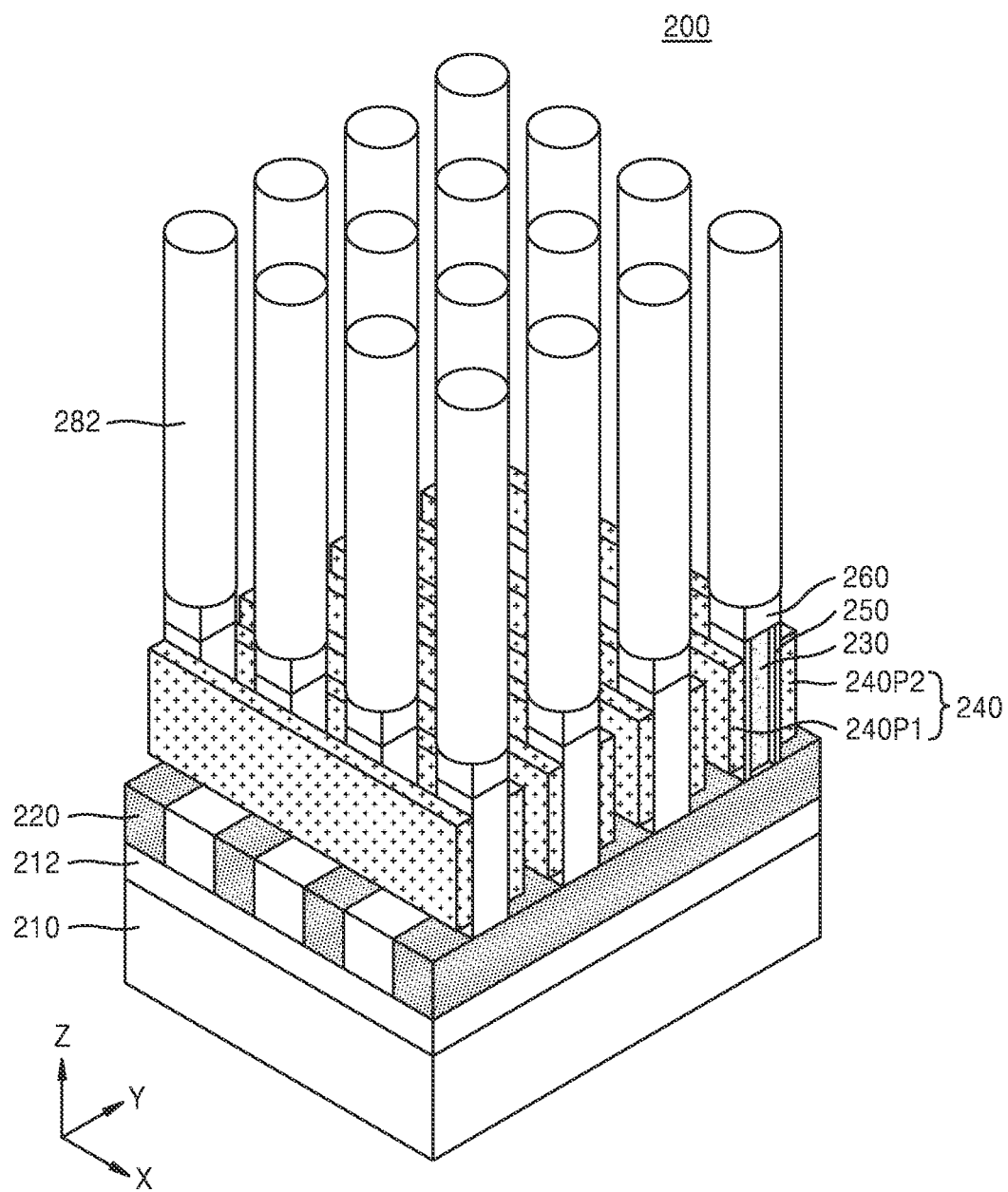
FIG. 8B is a diagram of components of a semiconductor device according to an example embodiment.
Figure 8C:
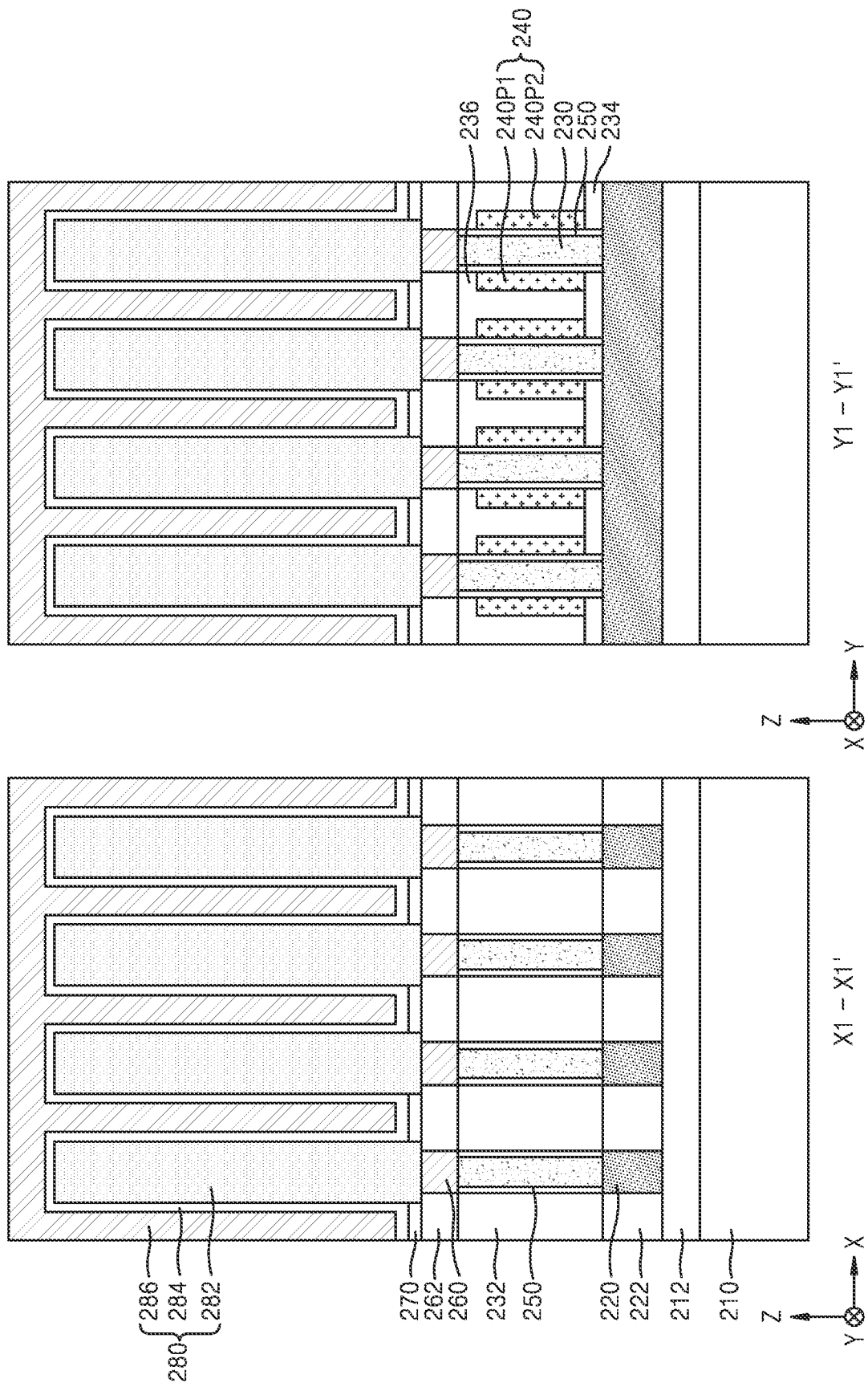
FIG. 8C is a cross-sectional view taken along lines X1-X1' and Y1-Y1' of FIG. 8A according to an example embodiment.

FIG. 8A is a diagram of a semiconductor device 200 according to an example embodiment. FIG. 8B is a diagram of components of a semiconductor device 200 according to an example embodiment. FIG. 8C is a cross-sectional view taken along lines X1-X1' and Y1-Y1' of FIG. 8A according to an example embodiment.

Referring to FIGS. 8A to 8C, the semiconductor device 200 may include a substrate 210, a plurality of first conductive lines 220, a channel layer 230, a gate electrode 240, a gate insulation layer 250, and a capacitor structure 280. The semiconductor device 200 may be a memory device including a vertical channel transistor (VCT). The VCT may refer to a structure in which the channel length of the channel layer 230 extends in a vertical direction from the substrate 210.

A lower insulation layer 212 may be disposed on the substrate 210, and, on the lower insulation layer 212, the plurality of first conductive lines 220 may be spaced apart from one another in the first direction (X direction) and may extend in the second direction (Y direction). A plurality of first insulation patterns 222 may be arranged on the lower insulation layer 212 to fill spaces between the plurality of first conductive lines 220. The first insulation patterns 222 may extend in the second direction (Y direction), and top surfaces of the plurality of first insulation patterns 222 may be at the same level as top surfaces of the plurality of first conductive lines 220. The plurality of first conductive lines 220 may serve as bit lines of the semiconductor device 200.

According to embodiments, the plurality of first conductive lines 220 may include a doped polysilicon, a metal, a conductive metal nitride, a conductive metal silicide, a conductive metal oxide, or a combination thereof. For example, the plurality of first conductive lines 220 may include a doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuO$_x$, or a combination thereof, but embodiments are not limited thereto. The plurality of first conductive lines 220 may include a single layer or multiple layers of the materials stated above. According to embodiments, the plurality of first conductive lines 220 may include a 2-dimensional semiconductor material, where the 2-dimensional semiconductor material may include, for example, graphene, carbon nanotube, or a combination thereof.

Channel layers 230 may be arranged in a matrix-like shape spaced apart from one another in the first direction (e.g., X direction) and the second direction (e.g., Y direction) above the plurality of first conductive lines 220. The channel layer 230 may have a first width in the first direction (e.g., X direction) and a first height in the third direction D3 (e.g., Z direction), where the first height may be greater than the first width. For example, the first height may be from about 2 times to about 10 times the first width, but is not limited thereto. The bottom portion of the channel layer 230 may function as a first source/drain region, the upper portion of the channel layer 230 may function as a second source/drain region, and a portion of the channel layer 230 between the first source/drain region and the second source/drain region may function as a channel region.

According to embodiments, the channel layer 230 may include an oxide semiconductor. For example, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Zn$_y$Sn$_z$O, Sn$_x$O, Hf$_x$In$_y$Zn$_z$O, Hf$_x$In$_y$ZnO Al$_x$Zn$_y$Sn$_z$O, Yb$_x$Ga$_y$Zn$_z$O, In$_x$Ga$_y$O, or a combination thereof. The channel layer 230 may include a single layer or multiple layers of the oxide semiconductor. According to some embodiments, the channel layer 230 may have a bandgap energy greater than that of silicon. For example, the channel layer 230 may have a bandgap energy from about 1.5 eV to about 5.6 eV. For example, the channel layer 230 may exhibit optimal channel performance when the channel layer 230 has a bandgap energy from about 2.0 eV to about 4.0 eV. For example, the channel layer 230 may be polycrystalline or amorphous, but embodiments are not limited thereto. According to embodiments, the channel layer 230 may include a 2-dimensional semiconductor material, where the 2-dimensional semiconductor material may include, for example, graphene, carbon nanotubes, or a combination thereof.

The gate electrodes 240 may extend in the first direction (e.g., X direction) on both sidewalls of the channel layer 230. The gate electrodes 240 may each include a first sub-gate electrode 240P1 facing a first sidewall of the channel layer 230 and a second sub-gate electrode 240P2 facing a second sidewall of the channel layer 230 opposite to the first sidewall of the channel layer 230. As one channel layer 230 is disposed between the first sub-gate electrode 240P1 and the second sub-gate electrode 240P2, the semiconductor device 200 may have a dual-gate transistor structure. However, embodiments of the disclosure are not limited thereto, and a single-gate transistor structure may be implemented as the second sub-gate electrode 240P2 is omitted and only the first sub-gate electrode 240P1 facing the first sidewall of the channel layer 230 is formed.

The gate electrode 240 may include doped polysilicon, a metal, a conductive metal nitride, a conductive metal silicide, a conductive metal oxide, or a combination thereof For example, the gate electrode 240 may include a doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but is not limited thereto.

The gate insulation layer 250 may surround sidewalls of the channel layer 230, and may be provided between the channel layer 230 and the gate electrode 240. For example, as shown in FIG. 8A, the entire sidewall of the channel layer 230 may be surrounded by the gate insulation layer 250, and a portion of the sidewall of the gate electrode 240 may contact the gate insulation layer 250. According to some embodiments, the gate insulation layer 250 may extend in the direction in which the gate electrode 240 extends (i.e., the first direction), and only two sidewalls of the channel layer 230 facing gate electrodes 240 from among the sidewalls of the channel layer 230 may contact the gate insulation layer 250.

According to embodiments, the gate insulation layer 250 may include a silicon oxide film, a silicon oxynitride film, a high-k film having a higher dielectric constant than a silicon oxide film, or a combination thereof. The high-k film may include a metal oxide or a metal oxynitride. For example, the high-k film that may be used as the gate insulation layer 450 may include, but is not limited to, HfO$_2$, HfSiO, HfSiON, HfTaO, HfTiO, HfZrO, ZrO$_2$, Al$_2$O$_3$, or a combination thereof.

A plurality of second insulation patterns 232 may extend in the second direction (e.g., Y direction) on the plurality of first insulation patterns 222, and the channel layer 230 may be disposed between two adjacent second insulation patterns 232 from among the plurality of second insulation patterns 232. Also, a first filling layer 234 and a second filling layer 236 may be arranged in a space between two adjacent channel layers 230 between two adjacent second insulation patterns 232. The first filling layer 234 may be disposed at the bottom of the space between two adjacent channel layers 230, and the second filling layer 236 may be formed on the first filling layer 234 to fill the remaining of the space between the two adjacent channel layers 230. The top surface of the second filling layer 236 may be at the same level as the top surface of the channel layer 230, and the second filling layer 236 may cover the top surface of the gate electrode 240. Alternatively, the plurality of second insulation patterns 232 may be formed as a material layer continuous with the plurality of first insulation patterns 222, or the second filling layer 236 may be formed as a continuous material layer with the first filling layer 234.

Capacitor contacts 260 may be arranged on the channel layers 230. The capacitor contacts 260 may be arranged to vertically overlap the channel layers 230 and may be arranged in a matrix-like shape spaced apart from one another in the first direction (e.g., X direction) and the second direction (e.g., Y direction). The capacitor contacts 260 may include a doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuO$_x$, or a combination thereof, but embodiments are not limited thereto. An upper insulation layer 262 may surround sidewalls of the capacitor contacts 260 on the plurality of second insulation patterns 232 and the second filling layer 236.

An etch stop layer 270 may be disposed on the upper insulation layer 262, and the capacitor structure 280 may be disposed on the etch stop layer 270. The capacitor structure 280 may include a lower electrode 282, a capacitor dielectric layer 284, and an upper electrode 286.

The lower electrode 282 may penetrate through the etch stop layer 270 and may be electrically connected to the top surface of a capacitor contact 260. The lower electrode 282 may be formed in a pillar-like shape extending in the third direction D3 (e.g., Z direction), but is not limited thereto. According to embodiments, lower electrodes 282 may be arranged to vertically overlap the capacitor contacts 260 and may be arranged in a matrix-like shape spaced apart from one another in the first direction (e.g., X direction) and the second direction (e.g., Y direction). Alternatively, landing pads may be further arranged between the capacitor contacts 260 and lower electrodes 282, and thus the lower electrodes 282 may be arranged in a hexagonal shape.

The capacitor structure 280 may further include a liner film for improving the T/B ratio of the lower electrode 282 and insulating the lower electrode 282 from other adjacent lower electrodes 282. The liner film may include a material similar to that of the liner film 170 described with reference to FIGS. 1 to 7I and may perform a similar function.

Figure 9:
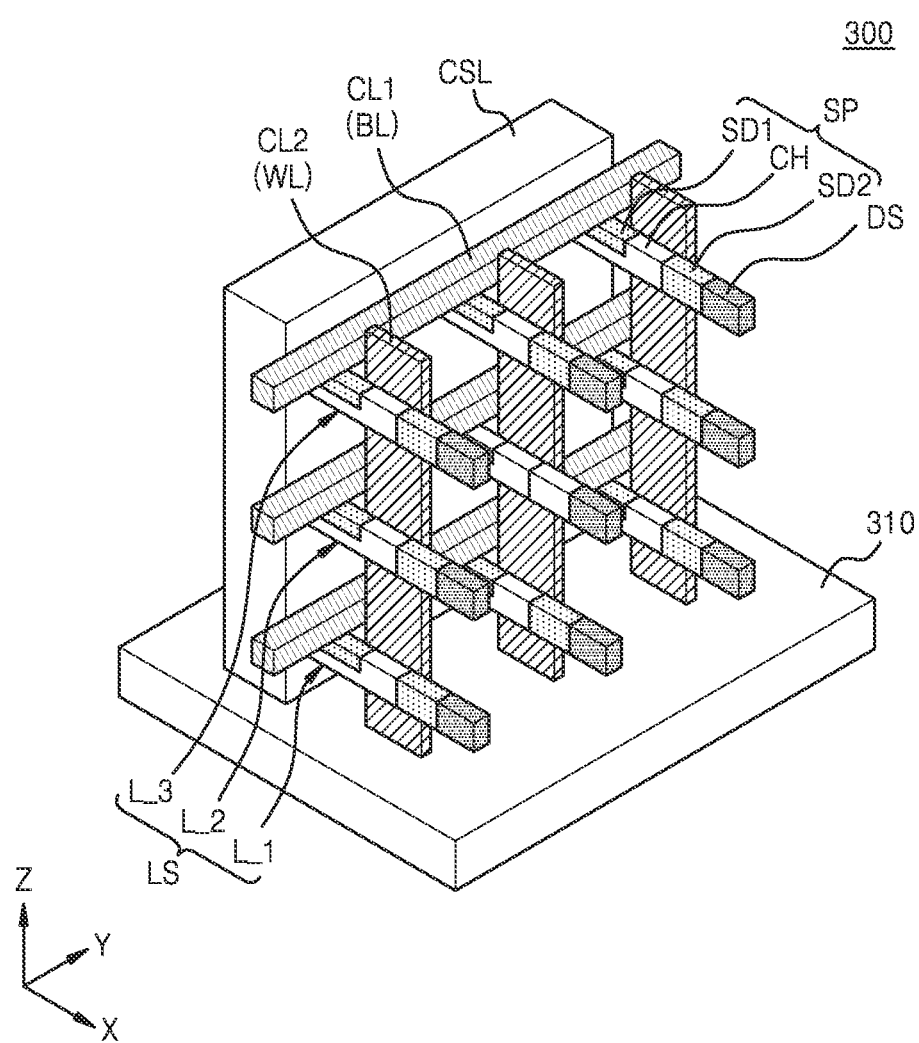
FIG. 9 is a diagram of a semiconductor device according to an example embodiment.

FIG. 9 is a diagram of a semiconductor device 300 according to an example embodiment.

A stack structure LS including first to third layers L_1, L_2, and L_3 may be provided on a substrate 310. The first to third layers L_1, L_2, and L_3 of the stack structure LS may be stacked while being spaced apart from one another in the vertical direction (i.e., the third direction D3). The first to third layers L_1, L_2, and L_3 may each include a plurality of semiconductor patterns SP, a plurality of data storage elements DS, and a first conductive line CL1.

The semiconductor patterns SP may have a linear shape, a bar-like shape, or a pillar-like shape extending in the second direction D2. For example, the semiconductor patterns SP may include silicon, germanium, silicon-germanium, or indium gallium zinc oxide (IGZO). The semiconductor patterns SP may each include a channel region CH, a first impurity region SD1, and a second impurity region SD2. The channel region CH may be disposed between the first impurity region SD1 and the second impurity region SD2. The channel region CH may correspond to the channel region of a memory cell transistor (MCT) described with reference to FIG. 1. The first impurity region SD1 and the second impurity region SD2 may correspond to a source and a drain of the MCT.

The data storage elements DS may be respectively connected to first ends of the semiconductor patterns SP. The data storage elements DS may be respectively connected to the second impurity regions SD2 of the semiconductor patterns SP. The data storage elements DS may be memory elements capable of storing data. The data storage elements DS may each be a memory element using a capacitor, a memory element using a magnetic tunnel junction pattern, or a memory element using a variable resistor including a phase change material. For example, the data storage elements DS may each be a capacitor.

According to some embodiments, the data storage elements DS may further include a liner film. The liner film may include a material similar to that of the liner film 170 described with reference to FIGS. 1 to 7I and may perform a similar function.

First conductive lines CL1 may have a linear shape or a bar-like shape extending in the first direction D1. The first conductive lines CL1 may be stacked to be spaced apart from one another in the third direction D3. The first conductive lines CL1 may include a conductive material. For example, the conductive material may include any one from among a doped semiconductor material (doped silicon, doped germanium, etc.), a conductive metal nitride (titanium nitride, tantalum nitride, etc.), a metal (tungsten, titanium, tantalum, etc.), and a metal-semiconductor compound (tungsten silicide, cobalt silicide, titanium silicide, etc.). The first conductive lines CL1 may be the bit lines BL.

A first layer L_1 from among the first to third layers L_1, L_2, and L_3 will be described in detail as a representative example. The semiconductor patterns SP of the first layer L_1 may be arranged to be spaced apart from one another in the first direction D1. The semiconductor patterns SP of the first layer L_1 may be positioned at the same first level. The first conductive line CL1 of the first layer L_1 may be disposed on the semiconductor patterns SP of the first layer L_1. The first conductive line CL1 may be disposed on top surfaces of the semiconductor patterns SP. The first conductive line CL1 may be disposed on top surfaces of first impurity regions SD1 of the semiconductor patterns SP. The first conductive line CL1 may be positioned at a second level higher than the first level at which the semiconductor patterns SP are positioned. For example, the first conductive line CL1 may be directly connected to the first impurity regions SD1. In some embodiments, the first conductive line CL1 may be connected to the first impurity regions SD1 through contacts, where the contacts may include a metal silicide. A second layer L_2 and a third layer L_3 may be substantially the same as that of the first layer L_1 given above.

Second conductive lines CL2 penetrating through the stack structure LS may be provided on the substrate 310. The second conductive lines CL2 may have a linear shape or a bar-like shape extending in the third direction D3. The second conductive lines CL2 may be arranged in the first direction D1. When viewed from above, the second conductive lines CL2 may each be provided between a pair of adjacent semiconductor patterns SP. The second conductive lines CL2 may extend vertically on sidewalls of the plurality of semiconductor patterns SP that are vertically stacked.

For example, any one second conductive line CL2 may be adjacent to a first semiconductor patterns SP from among the semiconductor patterns SP of the first layer L_1, a first semiconductor patterns SP from among the semiconductor patterns SP of the second layer L_2, and a first semiconductor patterns SP from among the semiconductor patterns SP of the third layer L_3. Another second conductive line CL2 may be adjacent to a second semiconductor patterns SP from among the semiconductor patterns SP of the first layer L_1, a second semiconductor patterns SP from among the semiconductor patterns SP of the second layer L_2, and a second semiconductor patterns SP from among the semiconductor patterns SP of the third layer L_3.

The second conductive lines CL2 may include a conductive material, and the conductive material may be any one of a doped semiconductor material, a conductive metal nitride, a metal, and a metal-semiconductor compound. The second conductive lines CL2 may be the word lines WL described with reference to FIG. 1.

A common source line CSL extending in the first direction D1 along one side surface of the stack structure LS may be provided on the substrate 310. Second ends of the semiconductor patterns SP may be connected to the common source line CSL. The common source line CSL may include a conductive material, and the conductive material may be any one of a doped semiconductor material, a conductive metal nitride, a metal, and a metal-semiconductor compound.

Empty spaces in the stack structure LS may be filled with an insulating material. For example, the insulating material may include at least one of a silicon oxide layer, a silicon nitride layer, and a silicon oxynitride layer.

According to example embodiments, when a nitride-rich metal nitride with high resistance is thinly deposited through an ALD process with relatively good step coverage, the metal nitride may be applied thickly on the top portion the hole of the opening and relatively thinly on the bottom portion the hole of the opening. As a result, the BT ratio may be reduced, and a subsequent lower electrode deposition process may be implemented as a one-step process.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor device comprising:
   a substrate;
   a lower electrode on the substrate and extending in a vertical direction;
   a supporter surrounding at least a portion of sidewalls of the lower electrode and supporting the lower electrode;
   a dielectric layer on the lower electrode and the supporter;
   an upper electrode on the lower electrode and at least a portion of the dielectric layer, wherein the dielectric layer is between the upper electrode and the lower electrode; and
   a liner film between the lower electrode and the supporter, the liner film surrounding an upper portion of the lower electrode,
   wherein the lower electrode comprises a first metal nitride comprising a first metal,
   wherein the liner film comprises a second metal nitride comprising a second metal,
   wherein a first ratio of the first metal in the first metal nitride is higher than a second ratio of the second metal in the second metal nitride, and
   wherein a third ratio of nitrogen atoms in the first metal nitride is lower than a fourth ratio of nitrogen atoms in the second metal nitride.

2. The semiconductor device of claim 1, wherein a horizontal width of the upper portion of the lower electrode surrounded by the liner film is greater than a horizontal width of a lower portion of the lower electrode, the lower portion of the lower electrode not being surrounded by the liner film.

3. The semiconductor device of claim 1, wherein the third ratio of nitrogen atoms in the first metal nitride is about 30 at % or higher and is less than about 50 at %, and
   wherein the fourth ratio of nitrogen atoms in the second metal nitride is about 50 at % or higher and is about 70 at % or less.

4. The semiconductor device of claim 1, wherein at least some portion of side surfaces of the liner film have a slope different from that of at least side surfaces of the lower electrode.

5. The semiconductor device of claim 1, wherein a first point corresponding to a largest horizontal width of the liner film is located farther from the substrate than a second point corresponding to a smallest horizontal width of the liner film.

6. The semiconductor device of claim 1, wherein the lower electrode includes a portion of which a horizontal width increases as a distance from the substrate in the vertical direction increases, and
   a slope of side surfaces of a lower portion of the lower electrode is different from a slope of side surfaces of the upper portion of the lower electrode.

7. The semiconductor device of claim 1, wherein a fifth ratio of a horizontal width of the liner film to a vertical depth of the liner film is greater than 0 and is about 1/80 or less.

8. The semiconductor device of claim 1, wherein a largest horizontal width of the liner film is from about 0.5 nm to about 1.5 nm.

9. The semiconductor device of claim 1, wherein the liner film comprises:
   a first portion surrounded by the supporter and contacting the supporter, and
   a second portion between the lower electrode and the dielectric layer, and contacting the dielectric layer, and
   wherein a horizontal width of the first portion of the liner film is greater than a horizontal width of the second portion of the liner film.

10. The semiconductor device of claim 9, wherein a largest horizontal width of the second portion of the liner film is greater than 0 nm and is less than or equal to about 0.75 nm.

11. The semiconductor device of claim 1, wherein a top surface of the liner film is on a same plane as a top surface of the lower electrode.

12. A semiconductor device comprising:
    a substrate;
    a structure on the substrate;
    a liner film over a lower electrode trench and penetrating the structure; and
    a lower electrode provided in the lower electrode trench and covering at least a portion of the liner film,
    wherein the structure comprises:
      a supporter surrounding at least a portion of sidewalls of the liner film and at least a portion of sidewalls of the lower electrode, and supporting the lower electrode;
      a dielectric layer on the lower electrode and the supporter; and
      an upper electrode on the lower electrode and at least a portion of the dielectric layer, wherein the dielectric layer is between the upper electrode and the lower electrode,
    wherein the lower electrode comprises a first metal nitride comprising a first metal,
    wherein the liner film comprises a second metal nitride comprising a second metal,
    wherein a first ratio of the first metal in the first metal nitride is higher than a second ratio of the second metal in the second metal nitride, and
    wherein a third ratio of nitrogen atoms in the first metal nitride is lower than a fourth ratio of nitrogen atoms in the second metal nitride.

13. The semiconductor device of claim 12, wherein a horizontal width of an upper portion of the lower electrode in which the liner film is provided is greater than a horizontal width of a lower portion of the lower electrode in which the liner film is not provided.

14. The semiconductor device of claim 12, wherein the lower electrode includes a portion of which a horizontal width increases as a distance from the substrate in a vertical direction increases, and a slope of side surfaces of a lower portion of the lower electrode is different from a slope of side surfaces of an upper portion of the lower electrode.

15. The semiconductor device of claim 12, wherein a first point corresponding to a largest horizontal width of the liner film is located farther from the substrate than a second point corresponding to a smallest horizontal width of the liner film.

16. The semiconductor device of claim 12, wherein at least some portion of side surfaces of the liner film have a slope different from that of side surfaces of the lower electrode.

17. The semiconductor device of claim 12, wherein the third ratio of nitrogen atoms in the first metal nitride is about 30 at % or higher and is less than about 50 at %, and wherein the fourth ratio of nitrogen atoms in the second metal nitride is about 50 at % or higher and is about 70 at % or less.

18. The semiconductor device of claim 12, wherein a fifth ratio of a horizontal width of the liner film to a vertical depth of the liner film is greater than 0 and is about 1/80 or less.

19. The semiconductor device of claim 12, wherein a largest horizontal width of the liner film is from about 0.5 nm to about 1.5 nm.

20. A semiconductor device comprising:
a substrate;
an active region defined by a device isolation layer in the substrate;
a word line in the substrate and extending across the active region in a first horizontal direction;
a bit line extending over the word line in a second horizontal direction perpendicular to the first horizontal direction; and
a capacitor at a level than a level of the bit line,
wherein the capacitor comprises:
a lower electrode on the substrate and extending in a vertical direction;
a supporter surrounding at least a portion of sidewalls of the lower electrode and supporting the lower electrode;
a dielectric layer on the lower electrode and the supporter;
an upper electrode on the lower electrode and at least a portion of the dielectric layer, wherein the dielectric layer is between the upper electrode and the lower electrode; and
a liner film surrounding an upper portion of the lower electrode,
wherein a horizontal width of the upper portion of the lower electrode surrounded by the liner film is greater than a horizontal width of a lower portion of the lower electrode, the lower portion of the lower electrode not being surrounded by the liner film,
wherein the lower electrode comprises a first metal nitride comprising a first metal,
wherein the liner film comprises a second metal nitride comprising a second metal,
wherein the first metal and the second metal comprise a same type of metal element,
wherein a first ratio of the first metal in the first metal nitride is higher than a second ratio of the second metal in the second metal nitride,
wherein a third ratio of nitrogen atoms in the first metal nitride is about 30 at % or higher and is less than about 50 at %, and
wherein a fourth ratio of nitrogen atoms in the second metal nitride is about 50 at % or higher and is about 70 at % or less.

* * * * *